(12) United States Patent
Kanno et al.

(10) Patent No.: US 8,053,780 B2
(45) Date of Patent: Nov. 8, 2011

(54) SEMICONDUCTOR ELEMENT, METHOD FOR MANUFACTURING THE SAME, LIQUID CRYSTAL DISPLAY DEVICE, AND METHOD FOR MANUFACTURING THE SAME

(75) Inventors: Yohei Kanno, Kanagawa (JP); Gen Fujii, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 305 days.

(21) Appl. No.: 10/577,057

(22) PCT Filed: Nov. 5, 2004

(86) PCT No.: PCT/JP2004/016797
§ 371 (c)(1), (2), (4) Date: Apr. 24, 2006

(87) PCT Pub. No.: WO2005/048354
PCT Pub. Date: May 26, 2005

(65) Prior Publication Data
US 2007/0131976 A1    Jun. 14, 2007

(30) Foreign Application Priority Data
Nov. 14, 2003    (JP) .................... 2003-386021

(51) Int. Cl.
*H01L 31/036* (2006.01)
*G02F 1/1333* (2006.01)
(52) U.S. Cl. ................ 257/72; 249/122; 249/138
(58) Field of Classification Search ............ 257/72, 257/770; 349/46, 139
See application file for complete search history.

(56) References Cited

U.S. PATENT DOCUMENTS

| 5,156,986 | A | * | 10/1992 | Wei et al. ............... 438/159 |
| 5,243,202 | A | * | 9/1993 | Mori et al. ............. 257/59 |
| 5,747,930 | A | | 5/1998 | Utsugi |
| 5,892,562 | A | | 4/1999 | Yamazaki et al. |
| 6,013,930 | A | | 1/2000 | Yamazaki et al. |
| 6,204,535 | B1 | | 3/2001 | Yamazaki et al. |
| 6,429,059 | B2 | | 8/2002 | Yamazaki et al. |
| 6,448,578 | B1 | * | 9/2002 | Shimada et al. ........ 257/59 |

(Continued)

FOREIGN PATENT DOCUMENTS
CN    1452451    10/2003

(Continued)

OTHER PUBLICATIONS
International Search Report for PCT/JP2004/016797 dated Feb. 1, 2005.

(Continued)

*Primary Examiner* — Matthew E Warren
(74) *Attorney, Agent, or Firm* — Nixon Peabody LLP; Jeffrey L. Costellia

(57) ABSTRACT

In case that a conventional TFT is formed to have an inversely staggered type, a resist mask is required to be formed by an exposing, developing, and droplet discharging in forming an island-like semiconductor region. It resulted in the increase in the number of processes and the number of materials. According to the present invention, a process can be simplified since after forming a source region and a drain region, a portion serving as a channel region is covered by an insulating film serving as a channel protecting film to form an island-like semiconductor film, and so a semiconductor element can be manufactured by using only metal mask without using a resist mask.

12 Claims, 15 Drawing Sheets

U.S. PATENT DOCUMENTS

| | | | |
|---|---|---|---|
| 6,573,955 B2 * | 6/2003 | Murade | 349/44 |
| 6,855,957 B1 | 2/2005 | Yamazaki et al. | |
| 6,894,311 B2 | 5/2005 | Maeda et al. | |
| 6,908,796 B2 | 6/2005 | Furusawa | |
| 6,956,236 B1 * | 10/2005 | Sasaki et al. | 257/72 |
| 7,037,766 B2 | 5/2006 | Maeda et al. | |
| 7,136,127 B2 | 11/2006 | Furusawa | |
| 7,285,305 B2 | 10/2007 | Furusawa et al. | |
| 7,399,704 B2 | 7/2008 | Fujii et al. | |
| 7,804,174 B2 | 9/2010 | Sasaki et al. | |
| 2003/0107039 A1 * | 6/2003 | Jung et al. | 257/72 |
| 2003/0219934 A1 | 11/2003 | Furusawa | |
| 2005/0122351 A1 | 6/2005 | Yamazaki et al. | |
| 2007/0057258 A1 | 3/2007 | Fukuchi et al. | |
| 2007/0090358 A1 | 4/2007 | Kanno et al. | |
| 2007/0102818 A1 | 5/2007 | Sasaki et al. | |

FOREIGN PATENT DOCUMENTS

| | | |
|---|---|---|
| CN | 1914737 | 2/2007 |
| EP | 0 684 753 A1 | 11/1995 |
| EP | 1 063 693 A1 | 12/2000 |
| EP | 1355522 | 10/2003 |
| GB | 2 211 992 A | 7/1989 |
| JP | 02-000025 | 1/1990 |
| JP | 06-275645 | 9/1994 |
| JP | 09-102727 | 4/1997 |
| JP | 2000-206509 | 7/2000 |
| JP | 2002-341367 | 11/2002 |
| JP | 2003-058077 | 2/2003 |
| JP | 2003-126760 | 5/2003 |
| JP | 2003-234355 | 8/2003 |
| JP | 2003-318131 | 11/2003 |
| JP | 2003-318192 | 11/2003 |
| KR | 03-99556 B1 | 9/2003 |
| WO | WO 2005-048223 A1 | 5/2005 |

OTHER PUBLICATIONS

Written Opinion of the International Searching Authority for PCT/JP2004/016797 dated Feb. 1, 2005.

Office Action for Chinese Patent Application No. 200480040428.3, dated Mar. 28, 2008.

Chinese Office Action (Third) dated Nov. 28, 2008 cited in Chinese Patent Application No. 200480040428.3, filed Nov. 5, 2004, (8 pp.) along with translation (pp. 1-12).

"Korean Office Action (Application No. 2006-7010990;PCTKR07497) Dated Feb. 17, 2011,".

"Chinese Office Action (Application No. 201010167923.8; PCTCN07497D1) Dated Mar. 17, 2011,".

* cited by examiner

DRYING OR BAKING

BAKING UNDER ATMOSPHERE CONTAINING OXYGEN OR OXYGEN PLASMA TREATMENT

SEMICONDUCTOR ELEMENT, METHOD FOR MANUFACTURING THE SAME, LIQUID CRYSTAL DISPLAY DEVICE, AND METHOD FOR MANUFACTURING THE SAME

TECHNICAL FIELD

The present invention relates to a semiconductor element using a droplet discharging as typified by ink jetting, and a method for manufacturing the same. More particularly, the present invention relates to a semiconductor element that is used for a display device as typified by a liquid crystal display device or an electroluminescent display device, and a method for manufacturing the same.

BACKGROUND ART

In manufacturing a semiconductor element, it has been considered the possibilities of using a droplet discharge device for forming a pattern of a thin film or a wiring, each of which is used for a semiconductor element, to reduce costs for equipment and to simplify a manufacturing process.

In this instance, various wirings such as a gate electrode, a scanning line, a signal line, and a pixel electrode for forming a semiconductor element are formed according to the procedure, that is, a composite formed by dissolving or dispersing a conductive material into a solvent is discharged from a nozzle of a droplet discharge device to the above of a substrate or a film so as to directly draw such various wirings (See, for example, Japanese Patent Application Laid-open No. 2003-126760).

To manufacture a semiconductor element such as a thin film transistor (TFT) that is used for a display device as typified by an active matrix liquid crystal display (LCD) device or an active matrix electroluminescent display device, it has been required to establish a structure and a process that are most appropriate to droplet discharging and that are different from a TFT manufactured by conducting repeatedly a film formation process, a patterning process, and an etching process. It has been required to simplify the structure and the process of a TFT manufactured by a droplet discharging with the increase in the size of a TFT substrate, for example, a substrate of more than 1×1 m or twice or three times as large as that.

Especially, in case that the foregoing TFT is formed to have an inversely staggered type (bottom gate type) as typified by a channel protecting type or a channel etching type, a semiconductor film and a semiconductor film containing n-type impurities are formed all over a substrate; and the formed semiconductor films are etched using a resist mask to form an island-like semiconductor region; then, the formed semiconductor film containing n-type impurities is divided into a source region and a drain region using a metal mask or the like. Hence, a resist mask is required to be formed by an exposing, developing, and droplet discharging in forming an island-like semiconductor region. It results in the increase in the number of processes and the number of kinds of materials.

In view of the foregoing, it is an object of the present invention to provide a method for manufacturing a semiconductor element that has the proper conditions to be actively formed by droplet discharging. According to the present invention, the high throughput manufacture of a high stable semiconductor element over various sized substrates can be realized in high yields for reduced tact time can be realized.

The followings are aspects of the present invention to solve the foregoing problems.

One aspect of the present invention provides a method for manufacturing a semiconductor element comprises the steps of forming a gate electrode layer by discharging a composite containing a first conductive material over a substrate; forming a gate insulating film over the gate electrode layer; forming a semiconductor film over the gate insulating film; forming a semiconductor film containing an impurity element of a single conductivity type over the semiconductor film; forming a source region and a drain region by discharging a composite containing a second conducive material over the semiconductor film containing an impurity element of a single conductivity type; forming an insulating film over a portion serving as a channel region in the semiconductor film; and forming an island-like semiconductor film by removing the semiconductor film using the source electrode, the drain electrode, and the insulating film as masks.

That is, a gate electrode layer is formed by droplet discharging over a substrate; a gate insulating film, a semiconductor film, a semiconductor film containing an impurity element of a single conductivity type (hereinafter, single conductivity semiconductor film) are stacked by a thin film formation method such as CVD or sputtering; and a source electrode and a drain electrode are formed by droplet discharging. Then, a source region and a drain region are formed by removing the exposed single conductivity semiconductor film by etching or the like. And then, an insulating film capable of being formed by droplet discharging or the like is formed thereover to cover to prevent the portion serving as a channel region of the semiconductor film from removing. In addition, the insulating film serves as a channel protecting film. An island-like semiconductor film is formed by removing the exposed semiconductor film by etching or the like by using the source electrode, the drain electrode, and the insulating film as masks. Through the foregoing process, a semiconductor element that seems like a channel protective type apparently can be obtained. Moreover, a desired liquid crystal display device or a light-emitting device can be obtained by providing a light-emitting element using a liquid crystal element, organic electroluminescent element, or the like, which is formed by connecting a pixel electrode to the source electrode or the drain electrode.

Another aspect of the present invention is that at least a portion provided with a gate electrode layer in a substrate is pretreated before discharging a composite containing a first conductive material over the substrate. As the pretreatment, the formation of a layer containing titanium, titanium oxide, or the like; the formation of a film formed by a substance which has a skeleton formed by the bond of silicon (Si) and oxygen (O), and which includes at least hydrogen as a substituent, or at least one selected from the group consisting of fluoride, alkyl group, and aromatic hydrocarbon as the substituent; plasma treatment; or the like can be nominated. The plasma treatment is preferably conduced in atmospheric pressure.

More another aspect of the present invention is that a source region and a drain region are formed; a first insulating film is formed over the source region and the drain region by CVD or sputtering; a second insulating film is formed over the first insulating film and over the portion serving as a channel region in the semiconductor film; and an insulating film serving as a channel protective film is formed to have a two-layered structure. The second insulating film serves as not only a channel protective film but also as a mask for removing a first protective film formed all over a substrate by CVD or the like. As the first insulating film, an insulating film containing silicon, preferably, a silicon nitride film is used. As the second insulating film, any insulating film can be used as long as it can be selectively formed by droplet discharging. Preferably, a film formed by a substance which has a skeleton formed by the bond of silicon (Si) and oxygen (O), and which includes at least hydrogen as a substituent, or at least one selected from the group consisting of fluoride, alkyl group, and aromatic hydrocarbon as the substituent can used as the second insulating film. The insulating film is not limited to a two-layered structure; the film can be formed to have a three or more laminated-layer.

A substance, which has a skeleton formed by the bond of silicon and oxygen, and which includes at least hydrogen as a substituent, or at least one selected from the group consisting of fluoride, alkyl group, and aromatic hydrocarbon as the substituent is referred to as siloxane-based resin. The siloxane-based resin is a kind of a heat resistant planarization film or a heat resistant interlayer (HRIL) film. Hereinafter, the term "heat resistant planarization film", "heat resistant interlayer film", "heat resistant resin", or "HRIL" includes the siloxane-based resin.

As droplet discharging for forming the conductive material or the insulating film, not only ink jetting but also offset printing or screen-printing can be used depending on the property of a film to be formed.

A semiconductor element according to the present invention comprises a layer containing titanium or a titanium oxide formed over a substrate; a gate electrode layer formed over the layer; a gate insulating film formed over the gate electrode layer; a semiconductor film formed over the gate insulating film; a pair of n-type impurity regions formed over the semiconductor film; an insulating film that is interposed between the pair of n-type impurity regions and that is formed over the semiconductor film; and a conductive layer formed over the pair of n-type impurity regions.

The insulating film is preferably formed to have a thickness of 100 nm or more to serve as a channel protecting film. Further, the insulating film may be formed to have a laminated-layer structure. For example, a bottom layer may be formed by a film that can be formed by CVD or sputtering such as a silicon nitride film, and a top layer may be formed by a film that can be formed by droplet discharging, for example, heat resistant resin such as polyimide, acrylic, or siloxane. Alternatively, both layers may be formed by films that can be formed by droplet discharging. The semiconductor film provided with the insulating film is preferably formed to have a thickness of 10 nm or more.

Conventionally, a source region and a drain region were formed by etching off a single conductivity semiconductor film after forming an island-like semiconductor film. Accordingly, it was necessary to provide a resist mask before forming an island-like semiconductor film. On the contrary, according to the present invention, after that a source region and a drain region are formed, an insulating film serving as a channel protective film is formed to cover a portion for serving as a channel region, then, an island-like semiconductor film is formed. Accordingly, a resist mask is not required to be formed, and so a process can be simplified. As discussed above, the present invention provides a novel means for forming a semiconductor element by combining a method for removing a single conductivity semiconductor film using a metal mask of a source electrode and a drain electrode to form a source region and a drain region, and a method, which is specific to a channel protective type, for forming a channel protective film to prevent a channel region from removing. According to the foregoing embodiment of present invention, a semiconductor element can be manufactured by using only a metal mask of a source electrode and a drain electrode without using any resist mask.

Before discharging a composite containing a first conductive material over a substrate, a pretreatment such as the formation of a titanium oxide (TiOx) or the like may be conducted over the substrate at least over the portion provided with a gate electrode layer. Accordingly, the adhesiveness between the substrate and a conductive film such as the gate electrode layer formed by droplet discharging can be improved.

By forming a semiconductor film provided with the insulating film to have a thinner thickness than that of the other semiconductor film, an n-type impurity region can be divided into a source region and a drain region completely. By forming the semiconductor film provided with the insulating film to have a thickness of 10 nm or more, enough large channel mobility can be obtained.

By forming the insulating film to have a thickness of 100 nm or more, the function as a channel protective film can be improved and the channel region can be surely prevented from damaging. Accordingly, a stable semiconductor element having high mobility can be provided. Further, to obtain the foregoing advantage, it is effective that the insulating film is formed to have a two-layer structure composed of a first insulating film and a second insulating film, or three or more laminated-layer structure.

DISCLOSURE OF INVENTION

A semiconductor element and a method for manufacturing the semiconductor element are explained with reference to FIGS. 1A to 1D.

A so-called photocatalytic substance such as titanium, or a titanium oxide; or heat resistant resin such as polyimide, acrylic, or siloxane is formed over a substrate 100 at least over a portion provided with a gate electrode layer. Here, a titanium oxide film 132 is formed. Alternatively, plasma treatment can be carried out. Such pretreatment results to improve the adhesiveness between the substrate 100 and a conductive film formed by discharging a composite containing a conductive material. In case of forming a titanium oxide, light-transmittance can be improved. The titanium oxide may be directly formed, or can be formed by baking a conductive film after forming a titanium film. Besides the titanium or the titanium oxide, a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), or tungsten oxide ($WO_3$) can be formed. The foregoing pretreatment is carried out as much as possible to improve the adhesiveness between the substrate and the conductive film.

In case of carrying out the pretreatment with the surface of the substrate 100, a gate electrode layer 102 is formed by discharging a composite containing a first conductive material over the pre-treated portion. Here, the gate electrode layer refers to a layer formed by a single layered or multiple layered conductor including at least a gate electrode portion of a TFT. The gate electrode layer is formed by discharging the composite; and drying the composite at 100° C.; then, baking the composite under nitride or oxide atmosphere at 200 to 350° C. for 15 to 30 minutes. However, it is not limited to the foregoing condition.

As the first conductive material, various materials depending on the function of the conductive film can be used. As typical examples are silver (Ag), copper (Cu), gold (Au), nickel (Ni), platinum (Pt), chrome (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), hard lead, tin oxide antimony, fluoride doped zinc oxide, carbon, graphite, glassy carbon, lithium, beryllium, sodium, magnesium, potassium, calcium, scandium, manganese, zirconium, gallium, niobium, sodium-potassium alloys, magnesium-copper mixtures, magnesium-silver mixtures, magnesium-aluminum mixtures, magnesium-indium mixtures, aluminum-aluminum oxide mixtures, lithium-aluminum mixtures, or the like, or particles or the like such as silver halide, or dispersible nanoparticles; or indium tin oxide (ITO) used as a conductive film, zinc oxide (ZnO), gallium zinc oxide (GZO) composed of zinc oxide doped with gallium, indium tin oxide (IZO) composed of indium oxide mixed with 2 to 20% of zinc oxide, organic indium, organic tin, titanium nitride, or the like can be used.

Silicon (Si) or silicon oxide (SiOx) may be contained in the foregoing conductive material, especially in case that the foregoing material is used for forming a transparent conductive film. For example, a conductive material composed of ITO containing silicon oxides (hereinafter, ITSO) can be used. Further, a desired conductive film may be formed by stacking layers formed by these conductive materials.

The diameter of a nozzle used for a droplet discharging means is set from 0.1 to 50 μm (preferably, 0.6 to 26 μm), and the discharge quantity is set from 0.00001 to 50 pl (preferably, 0.0001 to 10 pl). The discharge quantity is increased with the increase in the diameter of a nozzle. A subject and a discharge opening of a nozzle is preferably close to each other as much as possible to deliver drops to a desired portion. The distance between the subject and the discharge opening is preferably set approximately from 0.1 to 2 mm.

In consideration with the specific resistance value, the composite discharged from a discharge opening is preferably formed by dissolving or dispersing a material of gold, silver, or copper in a solvent. More preferably, low resistant silver or copper may be used. In case of using copper, a barrier film is preferably provided together as a countermeasure against impurities. As the solvent, esters such as butyl acetate or ethyl acetate; alcohols such as isopropyl alcohol or ethyl alcohol; an organic solvent such as methyl ethyl ketone or acetone; or the like can be used. As the barrier film in case of using copper as a wiring, a substance including nitrogen with an insulating property or a conducting property such as silicon nitride, silicon oxynitride, aluminum nitride, titanium nitride, or tantalum nitride (TaN) can be used to form the barrier film by droplet discharging.

A composite used for droplet discharging has preferably viscosity of 300 mPa·s or less to prevent desiccation and to be discharged smoothly from a discharge opening. The viscosity, the surface tension, or the like of a composite may be controlled depending on a solvent or application. As an example, a composite formed by dissolving or dispersing ITO, ITSO, organic indium, and organic tin in a solvent has viscosity of from 5 to 50 mPa·s, a composite formed by dissolving or dispersing silver in a solvent has viscosity of from 5 to 20 mPa·s, and a composite formed by dissolving or dispersing gold in a solvent has viscosity of from 10 to 20 mPa·s.

The diameter of a particle of a conductive material is preferably small as much as possible, preferably 0.1 μm or less to prevent clogging and to manufacture a high-definition pattern despite the fact that it depends on the diameter of each nozzle, a pattern form, or the like. A composite is formed by a known method such as an electrolytic method, an atomization method, or a wet-reduction method to have a grain diameter of from approximately 0.5 to 10 μm. In case that the composite is formed by a gas evaporation method, a nano molecule protected by a dispersing agent has a minute diameter of approximately 7 nm. Further, the nano particle whose surface is covered by a film-forming agent can be stably dispersed in a solvent without aggregation at room temperature, which shows just like the behavior of liquid. Therefore, a film-forming agent is preferably used.

Alternatively, a gate electrode layer may be formed by discharging a composite containing a particle in which a material of a single conductivity type covered by another conductive material. In this instance, a buffer layer is preferably provided between both of the conductive materials. The particle formed by covering Cu by Ag may have the structure in which a buffer layer of Ni or NiB is provided between the Cu and Ag.

By using actively a gas mixed with oxygen of 10 to 30% in a division ratio in a process for baking a composite containing a conductive material, the resistivity of a conductive film for forming the gate electrode layer can be reduced, and the conductive film can be formed into a thin and smooth film. An outline of the state of changes in a conductive film through a process of baking is given with reference to FIGS. 8A to 8C. FIG. 8A shows the state that nano paste 502 containing a conductive material such as Ag is discharged over a glass substrate 500 by a nozzle 501. The nano paste is formed by dispersing or dissolving a conductive material into an organic solvent. Besides, a dispersing agent or thermosetting resin referred to as binder is also contained in the organic solvent. Especially, the binder can prevent the nano paste from being cracked and being unevenly baked. By the drying and the baking processes, the organic solvent is evaporated, and a dispersing agent is decomposed to be removed, then, the nano paste is cured and contracted due to the binder, simultaneously. Accordingly, nano particles are fused with each other to cure the nano paste. Simultaneously, the nano particles are grown to a size of from several ten to hundred several ten nm, and the adjoining growing nano particles are welded and linked together to form metal chains. On the other hand, almost the left organic ingredients (approximately 80 to 90%) are pushed out to the outside of the metal chains. As a result, a conductive film containing metal chains 503 and a film formed by the organic ingredients 504 covering the surface are formed (FIG. 8B). In baking the nano paste 502 in the presence of nitrogen and oxygen, the film formed by organic ingredients 504 can be removed by the reaction of the oxygen in the gas and carbon or hydrogen contained in the film formed by organic ingredients 504. In case that oxygen is not contained in the baking atmosphere, the film formed by organic ingredients 504 can be removed by oxygen plasma treatment or the like (FIG. 8C). As discussed above, the film formed by organic ingredients 504 is removed in accordance with the procedure, that is, the nano paste is baked or dried in the presence of nitrogen and oxygen, and oxygen plasma treatment is carried out. Therefore, the conductive film containing metal chains 503 can be formed into a thin and smooth film, and reduced its resistivity.

Further, a solvent in a composite volatilizes by discharging the composite containing a conductive material under reduced pressure, and so the time for the subsequent heat treatment (drying or baking) can be reduced.

In addition to the drying and baking process, treatment for flattening and smoothing the surface can be carried out. As the treatment, CMP (chemical mechanical polishing); or a method for flattening the conductive film by etching after forming an insulating film having a planarization property over the conductive film.

As the substrate, a substrate formed by an insulator such as a glass substrate, a quartz substrate, or alumina; a plastic substrate having heat resistance capable of resisting process temperature in the subsequent treatment; or the like can be used. In this instance, a base insulating film for preventing impurities from diffusing from a substrate such as a silicon oxide (SiOx), a silicon nitride (SiNx), a silicon oxynitride (SiOxNy) (x>y), silicon nitride oxide (SiNxOy) (x>y), or the like, (x, y=1, 2 . . . ) may be formed. Alternatively, a metal such as stainless, or a semiconductor substrate provided with an insulating film such as silicon oxide or silicon nitride can be used.

A gate insulating film 103 is formed over the gate electrode layer. The gate insulating layer is formed by a film containing a silicon nitride, a silicon oxide, a silicon nitride oxide, or a silicon oxynitride in a single layer or a laminated-layer by a thin film forming method such as plasma CVD, sputtering, or the like. Here, a silicon oxide film, a silicon nitride film, and a silicon oxide film are formed sequentially over a substrate. However, it is not limited to the structure, the material, and the method.

A semiconductor film 104 is formed over the gate insulating film 103. The semiconductor film is formed by an amorphous semiconductor, a crystalline semiconductor, or a semi-amorphous semiconductor. As these semiconductors, a semiconductor film containing silicon, silicon germanium (SiGe), or the like as its main component can be used. The semiconductor film can be formed by plasma CVD to have preferably a thickness of from 10 to 100 nm.

Among the foregoing semiamorphous semiconductors, a SAS (Semi-Amorphous Silicon) is briefly explained. The SAS can be obtained by grow discharge decomposition of a silicide gas. As a typical silicide gas, $SiH_4$ can be used. Other silicide gas such as $Si_2H_6$, $SiH_2Cl_2$, $SiHCl_3$, $SiCl_4$, $SiF_4$, or the like can be used. The SAS can be formed easily by diluting the silicide gas with one kind or a plurality of kinds of a rare gas element selected from the group consisting of hydrogen, hydrogen and helium, argon, krypton, and neon. The dilution rate is preferably in the range of from 10 to 1000 times. Of course, a reaction product for forming a film is formed by grow discharge decomposition at a reduced pressure in the range of approximately from 0.1 to 133 Pa. High frequency current of from 1 MHz to 120 MHz, preferably, from 13 MHz to 60 MHz may be supplied for forming grow discharge. A temperature for heating a substrate is preferably 300° C. or less, more preferably, from 100 to 200° C.

An energy band width may be controlled to be from 1.5 to 2.4 eV, or from 0.9 to 1.1 eV by mixing a carbide gas such as $CH_4$ or $C_2H_6$, or a germanium gas such as $GeH_4$ or $GeF_4$ into the silicide gas.

The SAS shows weak n-type electrical conductivity when impurities are deliberately not doped to control a valency electron. This arises from the fact that oxygen is easily mixed into a semiconductor film since grow discharge at higher electricity is carried out than that for forming an amorphous semiconductor. Therefore, it becomes possible that a threshold value can be controlled by doping p-type impurities into the first semiconductor film provided with a channel formation region for a TFT simultaneously with or after the formation of the film. As impurities imparting p-type, boron can be typically used. An impurity gas of from 1 to 1000 ppm such as $B_2H_6$ or $BF_3$ may be mixed into a silicide gas. In case that boron is used as impurities imparting p-type, the boron may have a concentration of from $1\times10^{14}$ to $6\times10^{16}$ atoms/cm$^3$. By forming a channel formation region by the foregoing SAS, electron field-effect mobility of from 1 to 10 cm$^2$/V·sec can be obtained.

A crystalline semiconductor film can be obtained in accordance with the following procedure, that is, an amorphous semiconductor film is treated in a solution containing catalyst such as nickel; heat crystallization treatment is carried out at 500 to 750° C. to obtain a crystalline silicon semiconductor film; and laser crystallization is carried out to improve the crystallinity.

The crystalline semiconductor film can be obtained by forming directly a poly-crystalline semiconductor film by LPCVD (low pressure CVD) using a material gas of disilane ($Si_2H_6$) and fluoride germanium ($GeF_4$). The LPCVD is carried out in the conditions, but not exclusively, that is, a gas flow ratio of $Si_2H_6/GeF_4$=20/0.9, a film forming temperature of from 400 to 500° C., and a carrier gas of He or Ar.

An n-type semiconductor film 105 is formed over a semiconductor film 104. As an n-type impurity element, arsenic (As) and phosphorus (P) can be used. In case of forming an n-type semiconductor film, an n-type (n+) silicon film can be formed by the grow discharge decomposition of a mixed gas of $SiH_4$, $H_2$, and $PH_3$ (phosphine) using plasma CVD. Instead of the n-type semiconductor film 105, a semiconductor film containing p-type impurity elements such as boron (B) can be formed.

A source electrode 108 and a drain electrode 109 are formed by discharging a composite containing a second conductive material over the n-type semiconductor film 105. The second conductive material, a conductive particle structure, a discharge condition, a drying condition, a baking condition, or the like can be appropriately selected from those explained in the foregoing first conductive material. Further, the first and the second conductive materials and the first and the second particle structures may be the same or different (FIG. 1A).

Although not shown, pretreatment for improving the adhesiveness between the n-type semiconductor film 105 and the source electrode 108, and the adhesiveness between the n-type semiconductor film 105 and the drain electrode 109 may be conducted before discharging the composite containing the second conductive material over the n-type semiconductor film 105. The pretreatment may be conducted similar to the way the pretreatment for forming the gate electrode 102.

A source region 112 and a drain region 113 are formed by plasma etching the n-type semiconductor film 105 using the source electrode 108 and the drain electrode 109 as masks with an etching gas of a chlorine gas such as $Cl_2$, $BCl_3$, $SiCl_4$, or $CCl_4$; a fluoride gas such as $CF_4$, $SF_6$, $NF_3$, or $CHF_3$; or $O_2$. However, it is not limited to the conditions. The etching can be carried out by using atmospheric plasma. In this instance, a mixed gas of $CF_4$ and $O_2$ is preferably used as an etching gas. In case that the n-type semiconductor film 105 and the semiconductor film 104 are formed by the same semiconductor, attention needs to be paid to an etching rate and an etching time since the semiconductor film 104 is etched together when the n-type semiconductor film 105 is etched. However, enough mobility as a TFT can be obtained even if a part of the semiconductor film 104 is etched in case that a semiconductor film at a channel forming region is formed to have a thickness of 5 nm or more, preferably, 10 nm or more, more preferably, 50 nm or more.

An insulating film 115 is formed by droplet discharging over the channel region of the semiconductor film 104. Since the insulating film 115 serves as a channel protective film, it is formed by discharging a composite of heat resistant resin such as siloxane, or a substance having etching resistivity and insulating property such as acrylic, benzocyclobutene, polyamide, polyimide, benzimidazole, or polyvinyl alcohol. Siloxane and polyimide are preferably used. To prevent the channel region from being over etched, the insulating film 115 is formed to have a thickness of 100 nm or more, preferably 200 nm or more (FIG. 1B). Therefore, as shown in FIG. 1B, the insulating film 115 may be formed into like a mound over the source electrode 108 and the drain electrode 109.

Then, an island-like semiconductor film 118 is formed by plasma etching the semiconductor film 104 using the source electrode 108, the drain electrode 109, and the insulating film 115 as masks with an etching gas of a chlorine gas such as $Cl_2$, $BCl_3$, $SiCl_4$, or $CCl_4$; a fluoride gas such as $CF_4$, $SF_6$, $NF_3$, or $CHF_3$; or $O_2$. However, it is not limited to the conditions. The etching can be carried out by using atmospheric plasma. In this instance, a mixed gas of $CF_4$ and $O_2$ is preferably used as an etching gas. Further, since the insulating film 115 serving as a channel protective film is formed over the channel region 119 in the island-like semiconductor film 118, the channel region 119 is not damaged due to overetching in the foregoing etching process. Hence, a channel protective type TFT (channel stopper type) having stable characteristics and high mobility can be manufactured without any resist mask (FIG. 1C).

A liquid crystal element or a light-emitting element (typically, a light-emitting element utilizing electroluminescence) composed of layers containing organic compounds or inorganic compounds is provided by forming a source wiring 123 and a drain wiring 124 by discharging a composite containing a third conductive material so as to be in contact with the source electrode 108 and the drain electrode 109, and by connecting the source wiring 123 and the drain wiring 124 to a pixel electrode 126. Accordingly, an active matrix liquid crystal display device or a thin display device such as an electroluminescent device, each of which can be controlled by a semiconductor element manufactured by the foregoing processes, can be manufactured. The third conductive material, a conductive particle structure, a discharge condition, a drying condition, a baking condition, or the like can be appropriately selected from those explained in the foregoing first conductive material. Further, the second and the third conductive materials and the second and the third particle structures may be the same or different. The pixel electrode is preferably formed by droplet discharging of ITO, ITSO, ZnO, GZO, IZO, organic indium, organic tin, or the like (FIG. 1D).

Although not shown, pretreatment for improving the adhesiveness with the bottom layer can be carried out in forming the source wiring 123, the drain wiring 124, and the pixel electrode 126. The pretreatment can be conducted similar to the way of the pretreatment for forming the gate electrode layer 102.

As noted above, according to the present invention, after the source region 112 and the drain region 113 are formed, the portion serving as a channel region is covered by the insulating film 115 serving as a channel protecting film to form the island semiconductor film. Accordingly, a resist mask is not required, and so the process can be simplified. The present invention provides a novel means for forming a semiconductor element by combining a method for removing a single conductivity semiconductor film using a metal mask of a source electrode and a drain electrode to form a source region and a drain region, and a method, which is specific to a channel protective type, for forming a channel protective film to prevent a channel region from removing. A semiconductor element can be manufactured by using only a metal mask of a source electrode and a drain electrode without using any resist mask according to the foregoing structure. As a result, the process can be simplified, and the costs can be drastically reduced by the saving of materials. The high throughput manufacture of a high stable semiconductor element can be realized at low costs with high yields for a reduced tact time especially in case that a substrate of more than 1×1 m or a twice or three times as large as that.

In the semiconductor element according to the present invention, the adhesiveness between a substrate and a conductive film such as a gate electrode layer or the like formed by droplet discharging can be improved since at least a portion provided with the gate electrode layer in the substrate is treated such as the formation of a titanium oxide or the like.

By forming a portion of a semiconductor film provided with the insulating film to have a thinner thickness than that of the other semiconductor film, an n-type impurity region can be surely divided into a source region and a drain region. Further, by forming a portion of semiconductor film provided with a semiconductor film to have a thickness of from 5 nm or more, preferably, 10 nm or more, enough large channel mobility can be obtained.

In the semiconductor element according to the present invention, the insulating film 115 serving as a channel protective film is formed over the channel region 119, accordingly, the channel region 119 is not damaged due to overetching in etching the semiconductor film 104. Therefore, the semiconductor element has stable characteristics and high mobility. By forming the insulating film to have a thickness of 100 nm or more, the function of the insulating film as a channel protective film can be surely improved to prevent damages of the channel region. Therefore, a high stable semiconductor element having high mobility can be obtained. To obtain the foregoing advantages, it is effective that the insulating film can be formed to have a two-layered structure composed of the first insulating film and the second insulating film, or a multi-layered structure composed of three or more layers.

BEST MODE FOR CARRYING OUT THE INVENTION

Example 1

In Example 1, the case that a substrate is pretreated before forming a gate electrode layer thereover is explained.

Figure 1A:
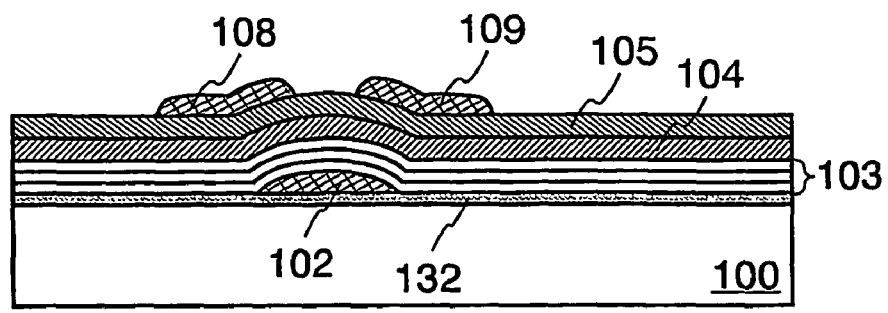
FIGS. 1A to 1D are schematic views for showing a process of a TFT according to the present invention.

As the first method, a titanium oxide film 132 can be directly formed over a substrate 100 as shown in FIG. 1A. The titanium oxide film 132 may be formed all over the substrate by spin coating, droplet discharging, spraying, sputtering, CVD, or the like. Thereafter, a gate electrode layer 102 is formed over the titanium oxide film 132 by droplet discharging. Accordingly, the adhesiveness between the substrate 100 and the gate electrode layer 102 can be improved by interposing the titanium oxide film 132 therebetween. After forming the gate electrode layer 102, the titanium oxide film 132 at the periphery of the gate electrode layer 102 may be left or removed by etching. Further, the etching treatment is preferably carried out at atmospheric pressure. In addition, a titanium film may be formed instead of forming the titanium oxide film. Here, the gate electrode layer 102 is formed by stacking Ag/Cu over the titanium oxide film. Alternatively, only Cu may be stacked over the titanium oxide film.

As the second method, a titanium oxide film can be selectively formed by droplet discharging. As the droplet discharging, screen printing or offset printing can be used in addition to ink jetting. Alternatively, sol-gel can be used. Thereafter, a gate electrode layer is selectively formed by droplet discharging over a titanium oxide layer or an inner surface of the titanium oxide layer. In addition, a titanium film may be formed instead of forming the titanium oxide film.

Figure 6C:
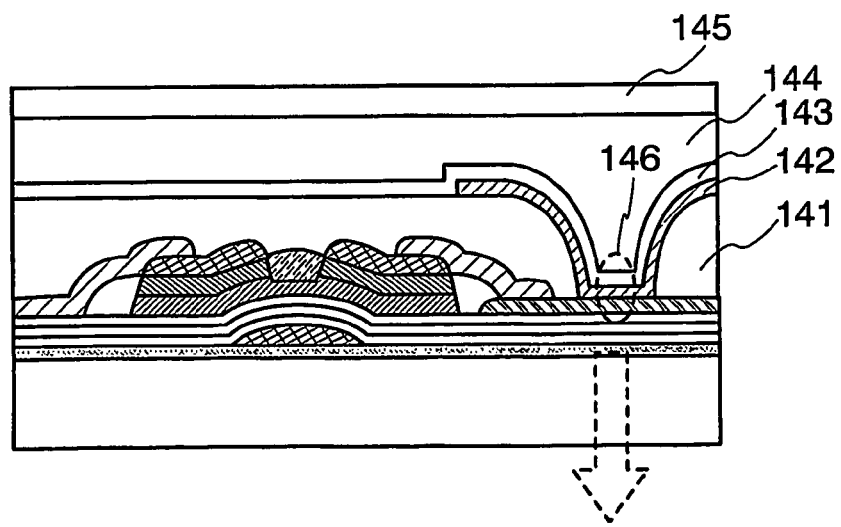
Figure 7B:
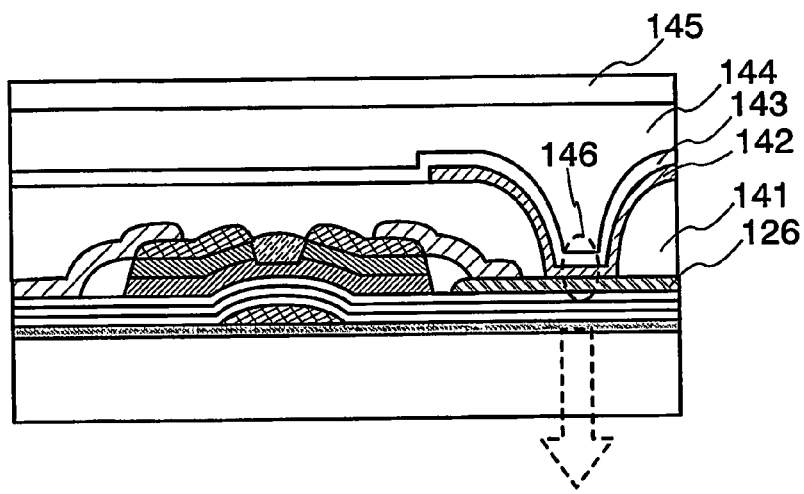
Figure 8A:
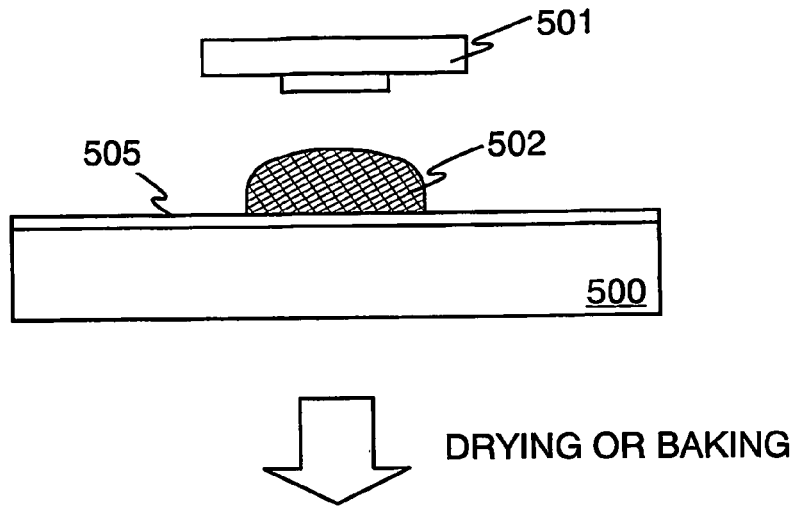
FIGS. 8A to 8C are explanatory views for showing a method for forming a titanium oxide film.
Figure 8B:
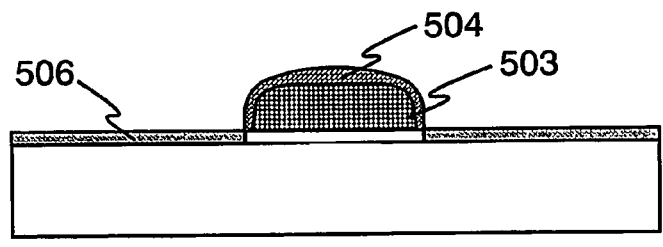
Figure 8C:
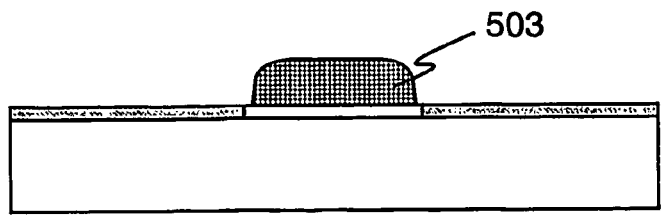

As the third method, a titanium film is formed all over a substrate by spin coating, droplet discharging, sputtering, CVD, or the like; and a composite containing a conductive material for forming a gate electrode layer are selectively formed over the titanium film by droplet discharging (FIG. 8A). Then, the composite is dried and baked. Simultaneously, the titanium film 505 is oxidized. Accordingly, a titanium oxide film 506 is formed at the periphery of the composite. The titanium oxide film is superior in light transmittance. For example, a titanium oxide film is effectively utilized in a bottom emission light-emitting device to emit light from a substrate as shown in FIGS. 6C and 7B. After forming the titanium film all over a substrate by spin coating, droplet discharging, sputtering, CVD, or the like, the titanium oxide film may be formed by heat treatment before discharging selectively the composite containing a conductive material for forming a gate electrode layer.

In the foregoing first to third methods, instead of forming the titanium film and the titanium oxide film, so-called a photocatalyst substance can be used such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Alternatively, with respect to oxides, substance before being oxidized (Zr, Nb, Zn, Fe, W, or the like) can be used.

As the fourth method, the adhesiveness between a substrate and an electrode layer can be improved by forming heat resistant resin such as polyimide, acrylic, siloxane, or the like over the substrate. These materials may be formed all over the substrate or over a region where the gate electrode layer is formed. In the case of forming the materials all over the substrate, a film left at the periphery of the gate electrode layer may be removed by etching or ashing.

As the fifth method, the adhesiveness can be improved by treating in plasma the portion where the substrate and the gate electrode layer are formed. Plasma treatment under atmospheric pressure is preferable, but not exclusively.

Example 2

In Example 2, the case that an insulating film serving as a channel protecting film is formed by stacking two layers is explained.

Figure 1B:
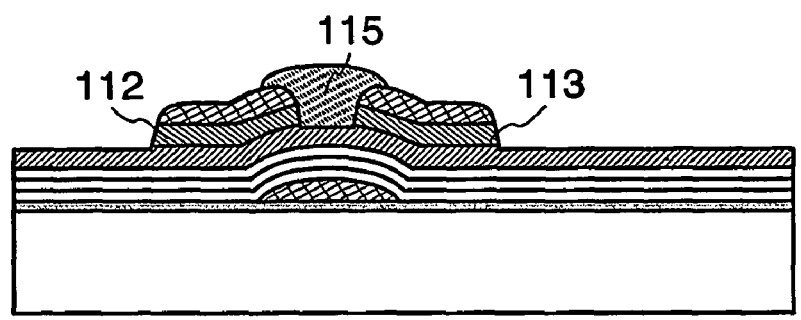
Figure 1C:
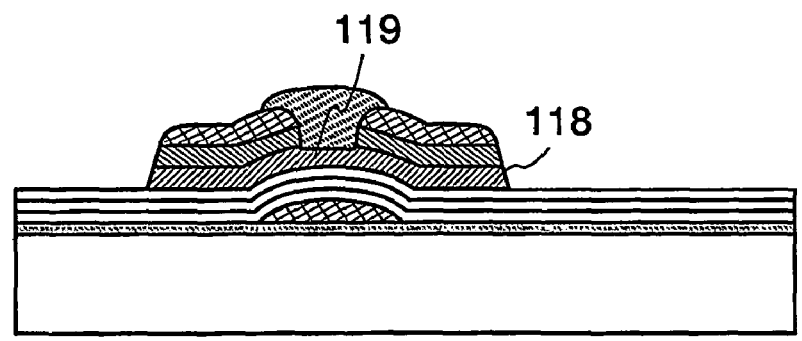
Figure 1D:
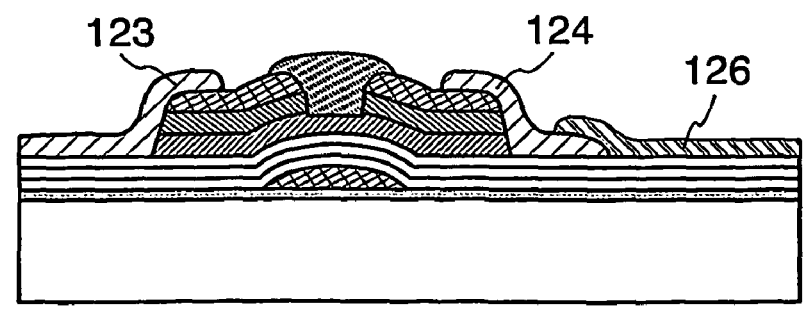
Figure 2A:
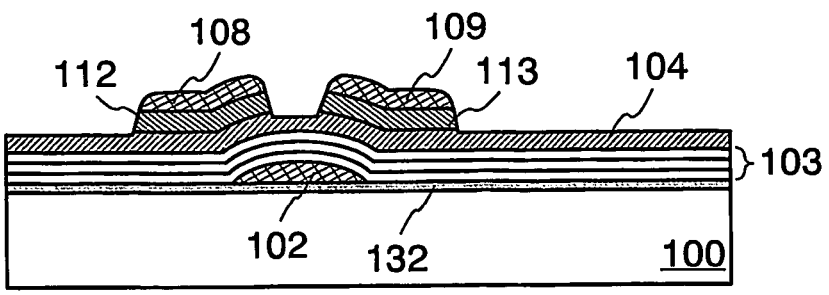
FIGS. 2A to 2D are schematic views for showing a process of a TFT according to the present invention.
Figure 2B:
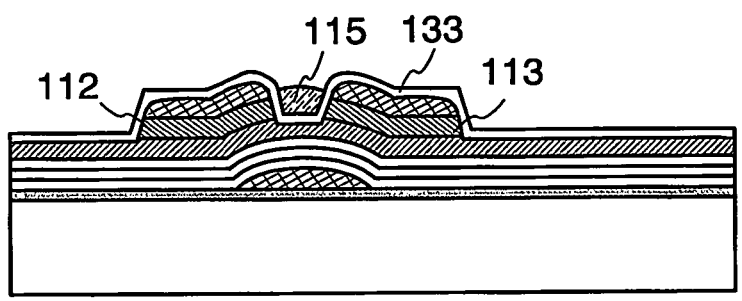

As shown in FIG. 1B, a source region 112 and a drain region 113 are formed by etching an n-type semiconductor film 105 using a source electrode 108 and a drain electrode 109 as masks. Then, a silicon nitride film 133 is formed all over the surface by CVD, sputtering, or the like (FIG. 2A). An insulating film 115 is formed by droplet discharging over the region that serves as a channel region of a semiconductor film and over the silicon nitride film 133. Since the insulating film 115 does not serve as a channel protecting film but a mask for removing the silicon nitride film 133, the insulating film 115 is formed by discharging a composite of heat resistant resin such as siloxane, or a substance having etching resistivity and insulating property such as acrylic, benzocyclobutene, polyamide, polyimide, benzimidazole, or polyvinyl alcohol. Siloxane and polyimide are preferably used. To prevent the channel region from being overetched, the silicon nitride film 133 and the insulating film 115 are preferably formed to have a total thickness of 100 nm or more, more preferably, 200 nm or more (FIG. 2B).

The silicon nitride film 133 is etched off by using the insulating film 115 as a mask to leave the insulating films 115, 134, each of which serves as a channel protecting film. The insulating film 134 is, needless to say, formed by a silicon nitride film. The silicon nitride film is etched by plasma etching with an etching gas of a chloride gas as typified by $Cl_2$, $BCl_3$, $SiCl_4$, $CCl_4$, or the like, a fluoride gas as typified by $CF_4$, $SF_6$, $NF_3$, $CHF_3$, or the like, or $O_2$. However, the etching gas is not limited thereto. The etching treatment can utilize atmospheric pressure plasma.

The two-layered channel protecting film can improve a function as a channel protecting film, prevent the channel region from being damaged, and provide a stable semiconductor element with high mobility. Alternatively, the channel protecting film may be formed by stacking three or more layers. The bottom layer thereof is not limited to a silicon nitride film; an insulating film containing another silicon may be used. Such channel protecting film may be formed by selectively stacking a film capable of being formed into a film by droplet discharging as the insulating film 115.

Figure 2C:
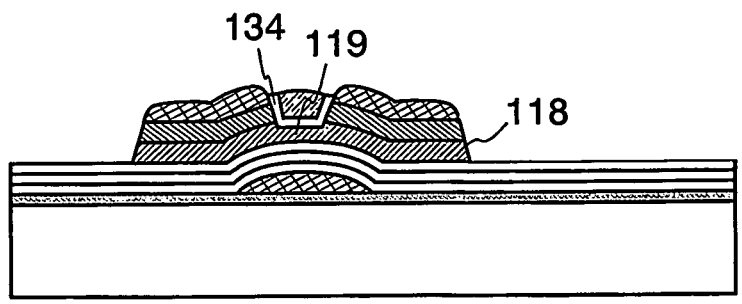

A semiconductor film 104 is etched by using the source electrode 108, a drain electrode 109, and the insulating films 115, 134 as masks to form an island-like semiconductor film 118. The insulating film 115 serving as a channel protecting film is formed over a channel region 119 in the island semiconductor film 118. Accordingly, damages due to overetching in the foregoing etching process can be prevented. Therefore, a channel protecting (channel stopper) TFT having stable characteristics and high mobility can be manufactured without any resist mask (FIG. 2C).

Figure 2D:
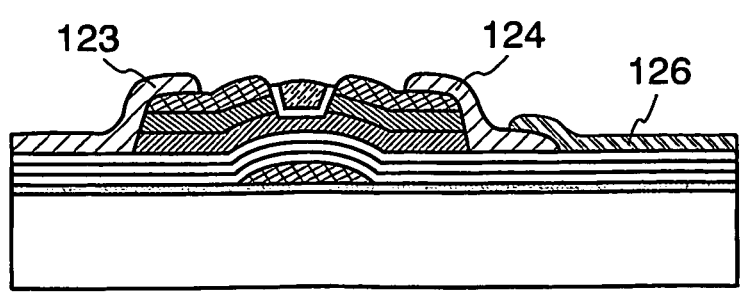

A source wiring 123 and a drain wiring 124 are formed by discharging a composite containing the third conductive material to be in contact with the source electrode 108 and the drain electrode 109 in a manner explained in Embodiment. Further, the source wiring 123 or the drain wiring 124 is connected to a pixel electrode. Then, a liquid crystal element or a light-emitting element is formed by a layer containing an organic compound or an inorganic compound (typically, a light-emitting element utilizing electroluminescence). Hence, a thin display such as an active matrix liquid crystal display device or an active matrix electroluminescent display device, each of which can be controlled by a semiconductor element manufactured by the foregoing process can be obtained (FIG. 2D).

Example 3

In Example 3, a method for forming a conductive film by combining droplet discharging with plating is explained.

Firstly, a composite containing Ag are formed by droplet discharging. In this instance, in case that a thick wiring is formed in a comparative narrow line width of several to ten several μm, the Ag is required to be discharged over and over. Alternatively, the line width can be increased by soaking a substrate provided with Ag in a plating solution containing Cu, or directly discharging the plating solution over the substrate. A composite formed by droplet discharging have especially many irregularities, accordingly, the plating can be easily carried out. In addition, Cu plating results the reduction of costs since Ag is expensive. A conductive material for forming a wiring by a method according to this example is not limited to the foregoing kinds.

After the Cu plating, the surface of the conductive film having irregularities is planarized by forming a buffer layer such as NiB or the like. Then, a gate insulating film is preferably formed.

Example 4

In Example 4, a method for manufacturing an active matrix LCD panel according to the present invention is explained with reference to FIGS. 3A to 5C.

Figure 3A:
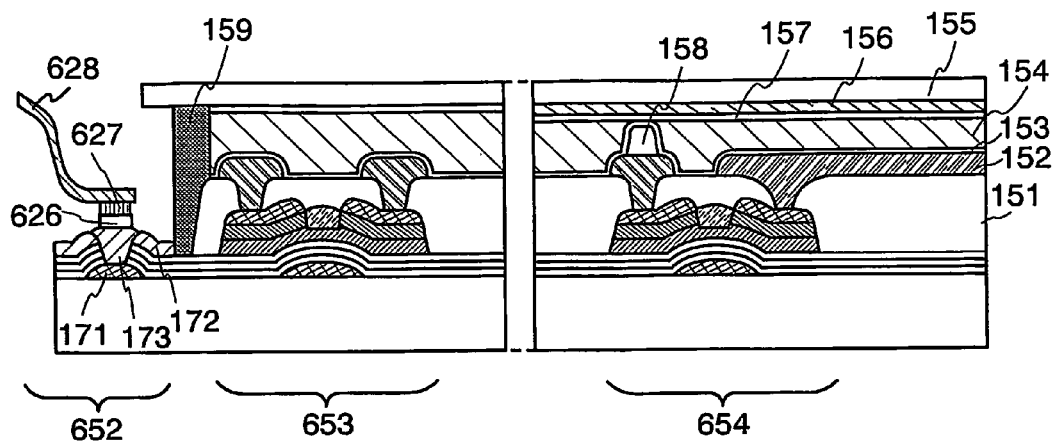
FIGS. 3A to 3C are schematic views for showing a process of a liquid crystal display panel according to the present invention.

As the first method, a planarization film 151 is selectively formed by droplet discharging over a TFT manufactured according to the present invention, and a source wiring and a drain wiring 152, each of which is connected to a source electrode and a drain electrode, are formed by droplet discharging over a region where the planarization film 151 is not formed as shown in FIG. 3A. Further, a source wiring or a drain wiring connected to a pixel TFT 654 can serve as a pixel electrode as shown in FIG. 3A. Of course, a pixel electrode can be separately formed to connect to the source wiring or the drain wiring. The source electrode, the drain electrode, the source wiring, and the drain wiring can be formed by the same conductive material, or different conductive material.

The method does not use the concept that a contact hole is formed in a planarization film. However, it seems that a contact hole is formed in appearance. Hence, the method is referred to as loose contact. As the planarization film, an organic resin such as acrylic, polyimide or polyamide, or an insulating film having a Si—O bond and a Si—$CH_x$ valence, which is formed by a siloxane-based material as a starting material, is preferably formed.

Thereafter, a liquid crystal layer 154 is interposed between a TFT substrate and an opposing substrate. These substrates are pasted together by sealant 159. A column spacer 158 is formed over the TFT substrate. The column spacer 158 may be formed along with a concave portion of a contact portion formed over the pixel electrode. The column spacer 158 is preferably formed to have a height of 3 to 10 μm despite the fact that it depends on a liquid crystal material. The contact portion has a concave portion corresponding to a contact hole. The distortion of liquid crystal orientation can be prevented by forming the spacer along with the concave portion.

An orientation film 153 is formed over the TFT substrate. Then, rubbing treatment is carried out. And then, a transparent conductive film 156 and an orientation film 157 are formed over an opposing substrate 155. Thereafter, the TFT substrate and the opposing substrate are pasted together by sealant to be injected with liquid crystal therebetween. As a result, a liquid crystal layer 154 is formed. Therefore, an active matrix liquid crystal display device can be completed. Further, the liquid crystal layer 154 may be formed by delivering liquid crystal by drops. Especially, it is an effective method in the case of manufacturing a liquid crystal display device by using a large active matrix substrate of more than 1 m.

Further, the orientation films 153, 157, and the column spacer 158 may be selectively formed by droplet discharging. Especially, it is an effective method in the case of manufacturing a liquid crystal display device by using a large active matrix substrate of more than 1 m.

A terminal portion 652 is explained hereinafter. As shown in FIG. 1 or the like, a gate insulating film is left in a region except a TFT element. Therefore, a contact hole for connecting a wiring 171 formed simultaneously with the gate electrode layer to an FPC 628 (Flexible Printed Circuit) is required. Here, the periphery of the region where a contact hole is to be formed is covered by a conductor 172 formed by droplet discharging, and a contact hole is formed by using the conductor as a mask. A conductor 173 that is same as the conductor 172 or different from the conductor 172 is discharged by droplet discharging to fill the contact hole. Accordingly, the conductors 172 and 173 can be formed over the gate insulating film. The wiring 171 can be connected to the FPC 628 by pasting the conductors 172, 173, and the FPC 628 to a terminal electrode 626 by an anisotropic conductive film 627 in accordance with a known method. The terminal electrode 626 is preferably formed by a transparent conductive film.

The contact hole in the FPC portion can be opened in manufacturing a TFT. Alternatively, the contact hole can be opened by forming the conductor 172 or 173 simultaneously with forming the source wiring and the drain wiring. The droplet discharging has an advantage that a composite can be selectively discharged at the desired spot. One process of the droplet discharging preferably serves as a plurality of the conventional processes.

Through the foregoing processes, an active matrix LCD panel using a TFT manufactured according to the present invention is completely manufactured. The TFT can be formed by the method explained in Embodiments or Examples. Here, one transistor is provided to one pixel. However, two or more transistors can be provided to one pixel. The polarity of the TFT may be either an n-type or a p-type. The TFT may be formed to have a CMOS structure composed of an n-type TFT and a p-type TFT. It is similar in the case of a drive circuit TFT 653. In case of forming a CMOS structure, wirings for connecting each TFT can be formed by droplet discharging of a composite containing a conductive material in an opening portion after selectively forming the foregoing planarization film.

Figure 3B:
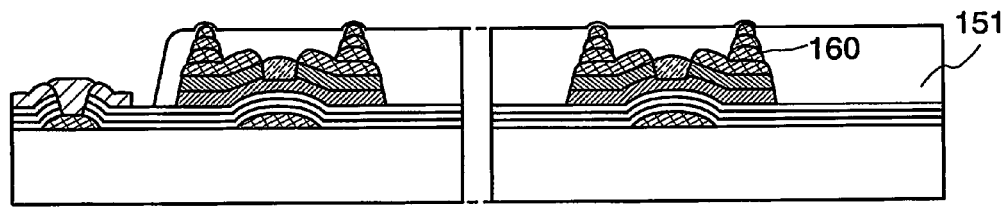

As the second method, as shown in FIG. 3B, a column-like conductor 160 (also referred to as a pillar, plug, or the like) is formed by droplet discharging over a source electrode and a drain electrode of a TFT manufactured according to the present invention. As a conductive material for forming the pillar, a similar material for forming the foregoing gate electrode layer or the like can be used. A planarization film 150 is formed over the column-like conductor 160 by droplet discharging or the like. As the planarization film, an organic resin such as acrylic, polyimide or polyamide, or an insulating film having a Si—O bond and a Si—CH$_x$ valence, which is formed by a siloxane-based material as a starting material, is preferably formed by selectively droplet discharging.

Figure 3C:
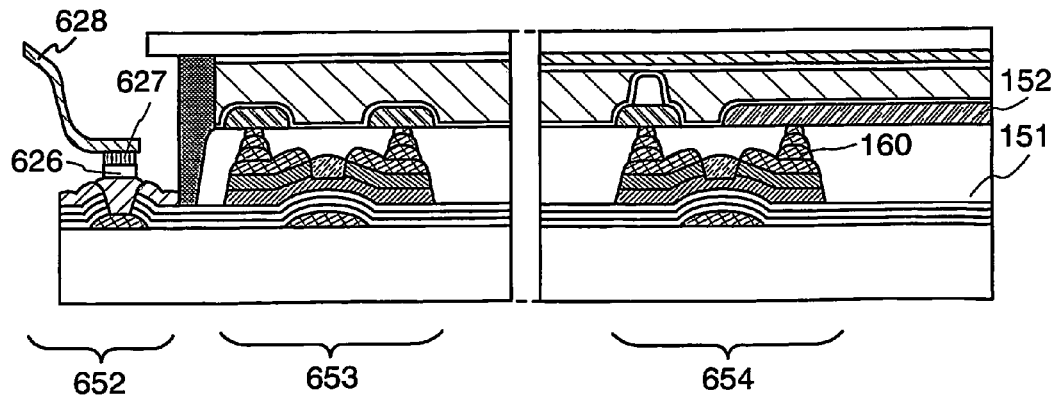

In the case that a planarization film is formed over the pillar, the surface of the planarization film and the pillar is etched to obtain a pillar having a planarized surface as shown FIG. 3C. A source wiring and a drain wiring 152 for connecting to a source electrode and a drain electrode is formed over the planarization film by droplet discharging. The source wiring and the drain wiring 152 connected to the pixel TFT 654 can serve as a pixel electrode as shown in FIG. 3C. Needless to say, the pixel electrode can be formed separately to connect to the source wiring or the drain wiring. Further, the source electrode, the drain electrode, the pillar, the source wiring, and the drain wiring are formed by the same conductive materials or different conductive materials.

Thereafter, a process for forming a liquid crystal element is the same as the first method. The contact hole in the FPC portion can be opened in manufacturing a TFT. Alternatively, the contact hole can be opened by forming the conductor 172 or 173 simultaneously with forming the pillar, the source wiring, and the drain wiring.

Figure 4A:
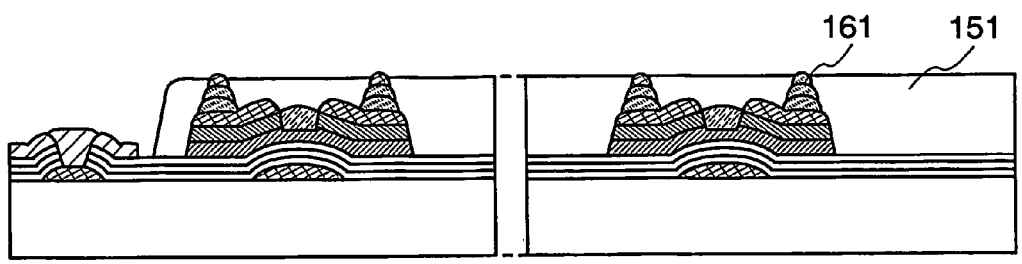
FIGS. 4A and 4B are schematic views for showing a process of a liquid crystal display panel according to the present invention.

As the third method, as shown in FIG. 4A, a column-like insulator having liquid-shedding quality with respect to the material of a planarization film 151 (hereinafter, pillar insulator 161) is formed over the source electrode and the drain electrode manufactured according to the present invention by droplet discharging; and the planarization film 151 is formed at the periphery of the pillar insulator 161. As a material for the pillar insulator, water-soluble organic resin such as PVA (polyvinyl alcohol) that is treated in CF$_4$ plasma to have liquid-shedding quality can be used. As the planarization film, an organic resin such as acrylic, polyimide or polyamide, or an insulating film having a Si—O bond and a Si—CH$_x$ valence, which is formed by a siloxane-based material as a starting material, is preferably formed by selectively droplet discharging. After forming the planarization film 151 at the periphery of the pillar insulator 161, the pillar insulator 161 can be easily removed by water washing, etching, or the like. In case of removing by etching, an anisotropic etching is preferably carried out to prevent a contact hole from being a reverse-taper form. Further, since the pillar insulator such as PVA has an insulating property, there will arise no problem even if a part of the pillar insulator is left at the sidewall of the contact hole.

Figure 4B:
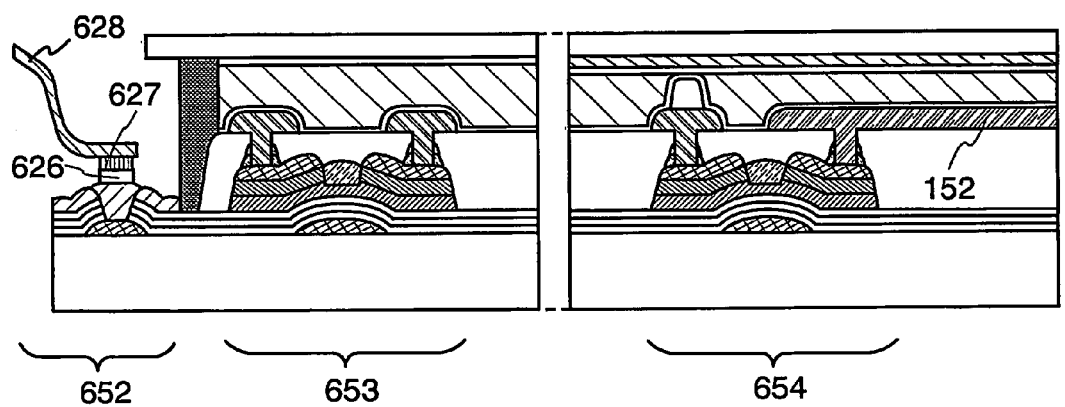

Thereafter, a source wiring and a drain wiring 152 connected to a source electrode and a drain electrode via a contact hole are formed by droplet discharging over the planarization film. The source wiring or the drain wiring 152 connected to the pixel TFT 654 can serve as a pixel electrode as shown in FIG. 4B. Needless to say, the pixel electrode can be formed separately to connect to the source wiring or the drain wiring. Further, the source electrode, the drain electrode, the pillar, the source wiring, and the drain wiring are formed by the same conductive materials or different conductive materials. In case that a contact hole is formed to have a reverse-taper form due to a removing process of the foregoing pillar insulator, a composite containing a conductive material may be stacked by droplet discharging to fill the contact hole in forming the source wiring and the drain wiring.

A process for forming a liquid crystal is the same as the first method. The opening of the contact hole in the FPC portion can be carried out in manufacturing a TFT. Alternatively, the contact hole can be opened by forming the conductor 172 or 173 simultaneously with forming the source wiring and the drain wiring.

Figure 5A:
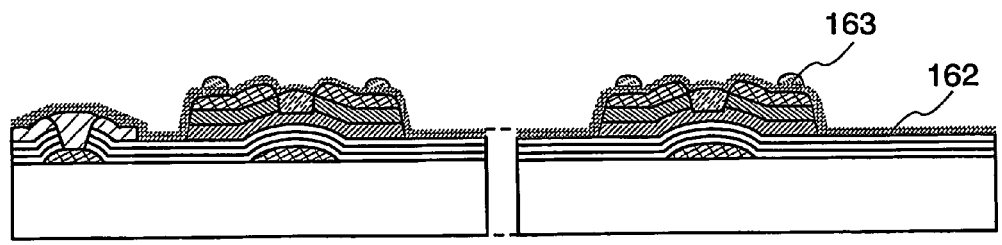
FIGS. 5A to 5C are schematic views for showing a process of a liquid crystal display panel according to the present invention.
Figure 5B:
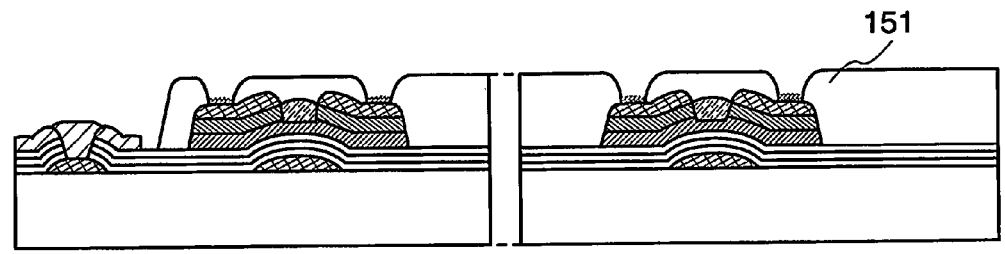

As the fourth method, as shown in FIG. 5A, a liquid-shedding material 162 with respect to a material of a planarization film 151 is formed over a source electrode and a drain electrode of a TFT manufactured according to the present invention by droplet discharging, spin coating, spraying, or the like; a mask 163 is formed by PVA, polyimide, or the like is formed to the region where a contact hole is to be formed; the liquid-shedding material 162 is removed by using PVA or the like; and a planarization film 151 is formed at the periphery of the left liquid-shedding material 162. As a material for forming the liquid-shedding material 162, a fluorine silane coupling agent such as FAS (fluoroalkylsilane) or the like can be used. The mask 163 such as PVA, polyimide, or the like may be selectively formed by droplet discharging. The liquid-shedding material 162 can be removed by O$_2$ aching or atmospheric pressure plasma. Further, the mask 163 formed by PVA can be easily removed by water washing, or the mask 163 formed by polyimide can be easily removed by a stripper N300.

In the state that the liquid-shedding material 162 is left at the region where a contact hole is to be formed (FIG. 5B), the planarization film 151 is formed by droplet discharging, spin coating, or the like. Since the liquid-shedding material 162 is left at the region where a contact hole is to be formed, the planarization film is not formed thereover. Further, the contact hole is not likely to be formed in a reverse-taper shape. As the planarization film, an organic resin such as acrylic, polyimide or polyamide, or an insulating film having a Si—O bond and a Si—CH$_x$ valence, which is formed by a siloxane-based material as a starting material, is preferably formed by selectively droplet discharging. After forming the planarization film 151, the liquid-shedding material 162 is removed by O$_2$ ashing or atmospheric pressure.

Figure 5C:
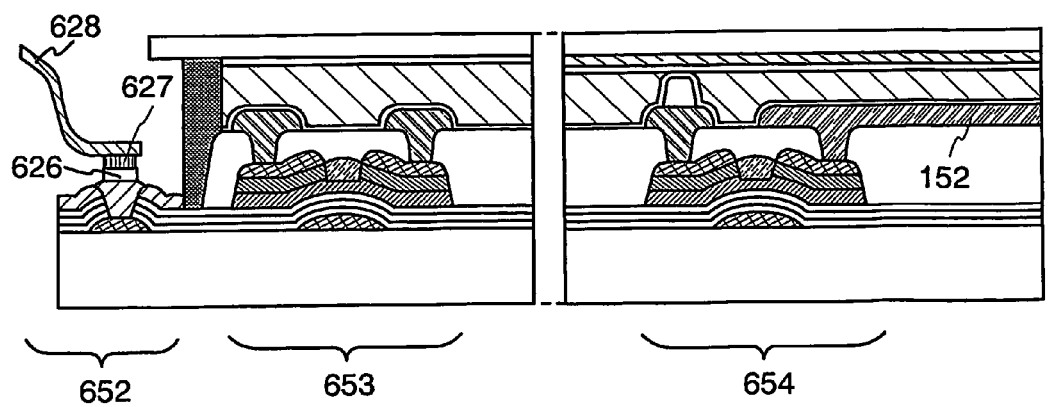

Thereafter, a source wiring and a drain wiring 152 connected to a source electrode and a drain electrode via a contact hole are formed by droplet discharging over the planarization film. The source wiring or the drain wiring 152 connected to the pixel TFT 654 can serve as a pixel electrode as shown in FIG. 5C. Needless to say, the pixel electrode can be formed separately to connect to the source wiring or the drain wiring. Further, the source electrode, the drain electrode, the source wiring, and drain wiring are formed by the same conductive materials or different conductive materials.

A process for forming a liquid crystal is the same as the first method. The opening of the contact hole in the FPC portion can be carried out in manufacturing a TFT. Alternatively, the contact hole can be opened by forming the conductor 172 or 173 simultaneously with forming the source wiring or drain wiring.

In the foregoing first to fourth methods, not shown in FIGS. 3A to 5C, the adhesiveness between the substrate and the gate electrode layer may be improved by interposing a TiOx film or the like therebetween by pretreatment. The pretreatment can be carried out in case of forming the source wiring, the drain wiring, the pillar, the pixel electrode, the conductor 172, the conductor 173, or the like. As the pretreatment, the treatment explained in Embodiments and Examples can be used.

In addition, a passivation film for preventing impurities from dispersing over the TFT is preferably formed over the source electrode and the drain electrode (not shown). The passivation film can be formed by silicon nitride, silicon oxide, silicon nitride oxide, silicon oxynitride, aluminum oxynitride; or the other insulating materials such as aluminum oxide, diamond like carbon (DLC), or carbon containing nitrogen (CN) by a thin film formation method such as plasma CVD, or sputtering. The material may be the same as that used for forming the channel protecting film. Alternatively, these materials can be stacked. Further, the passivation film can be formed by a composite containing particles that are insulating materials by droplet discharging.

A pixel electrode may be indirectly formed over a substrate without providing the planarization film, and an orientation film may be formed thereover (not shown). In this instance, a TFT is preferably covered by a cap insulating film or a passivation film.

Example 5

In Example 5, a method for manufacturing an active matrix electroluminescent panel according to the present invention is explained with reference to FIGS. 6A to 6C.

Figure 6A:
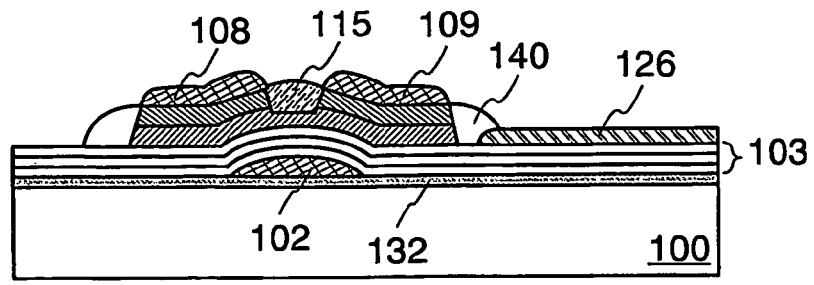
FIGS. 6A to 6C are schematic views for showing a process of an electroluminescent panel according to the present invention.
Figure 6B:
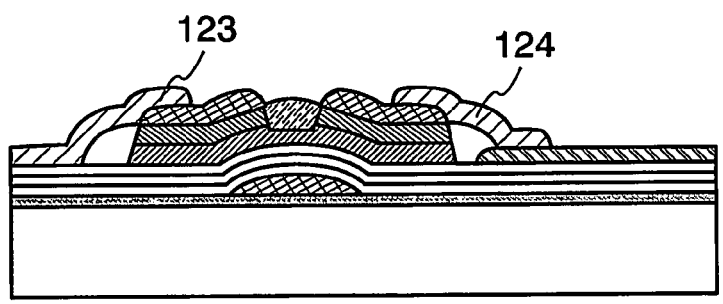

Firstly, as shown in FIG. 6A, a TFT is manufactured according to the foregoing methods explained in Examples and Embodiments. Then, an insulator 140 for improving step coverage (also referred to as edge cover) is formed at least the side of an island-like semiconductor film. A source wiring 123 and a drain wiring 124 are formed to be in contact with a source electrode 108 and a drain electrode 109 of the TFT, respectively. The source electrode and the drain electrode is connected to a pixel electrode 126 (in general, a hole injecting electrode (anode)). In this instance, the wirings can be formed smoothly with good coverage since the edge cover is provided below the wirings. Accordingly, breaking can be prevented (FIG. 6B).

Further, the pixel electrode 126 may be formed to have a lamination structure. For example, the lamination structure of ITSO is adopted in which silicon oxide concentration of the TFT side ITSO is preferably set low concentration (1 to 6 atomic %), and silicon oxide concentration of the light-emitting element side ITSO is preferably set high concentration (7 to 15 atomic %). The surface of the pixel electrode 126 may be smoothed by CMP or by polishing by a poly vinyl alcohol porous body. After polishing by CMP, the surface of the pixel electrode 126 may be irradiated with ultraviolet rays or treated in oxygen plasma.

After forming the pixel electrode 126 by etching, indium, tin, an indium oxide, or a tin oxide is released from the inside of a conductive layer composing the pixel electrode 126 by resist peeling process, hydro cleaning (water washing) process, ultraviolet irradiation process, or the like. Accordingly, silicon, a silicon oxide, a silicon nitride, or the like is precipitated within a layer at the surface or the vicinity of the surface of the conductive layer to form a barrier layer formed by the precipitated materials as main components. The barrier layer may be intentionally formed by silicon, a silicon oxide, a silicon nitride, or the like by vapor deposition, sputtering, or the like. The barrier layer can increase the work function of the hole injecting electrode and improve the hole injecting property.

The TFT, the wirings, and a top portion of the pixel electrodes are covered by a bank selectively formed by droplet discharging. As the bank 141, an insulating film having a Si—O bond and a Si—CH$_x$ valence, which is formed by organic resin such as acrylic, polyimide, or polyamide; or a siloxane-based material as a starting material is preferably used.

Then, a layer containing an organic compound (also referred to as electroluminescent layer, hereinafter, "organic compound layer 142") is formed so as to be in contact with the pixel electrode 126 at an opening of the bank 141. The organic compound layer 142 may be formed by a single layer or a laminated-layer. For example, the organic compound layer 142 may have the configuration: 1) anode\hole injecting layer\hole transporting layer\light-emitting layer\electron transporting layer\cathode; 2) anode\hole injecting layer\light-emitting layer\electron transporting layer\cathode; 3) anode\hole injecting layer\hole transporting layer\light-emitting layer\electron transporting layer\electron injecting layer\cathode; 4) anode\hole injecting layer\hole transporting layer\light-emitting layer\hole blocking layer\electron transporting layer\cathode; 5) anode\hole injecting layer\hole transporting layer\light-emitting layer\hole blocking layer\electron transporting layer\electron injecting layer\cathode, or the like.

An electron injecting electrode 143 (cathode) is formed to cover the organic compound layer 142. The electron injecting electrode 143 can be formed by a known material having a small work function such as Ca, Al, CaF, MgAg, or AlLi. A light-emitting element 146 is formed by overlapping the pixel electrode 126, the organic compound layer 142, and the electron injecting electrode 143 at the opening portion of the bank 141. A passivation film 144 is formed over the electron injecting electrode 143 (FIG. 6C).

The foregoing light-emitting element is composed of laminated light-emitting layers containing an organic compound or an inorganic compound, each of which has a different carrier transporting property, interposed between a pair of electrodes. Holes are injected from the electrode and electrons are injected from another electrode. The light-emitting element utilizes the phenomenon that holes injected from the electrode and electrons injected from another electrode are recombined with each other to excite an emission center, and excited molecules radiate energy as light while returning to the ground state. The size of a work function of a material for forming an electrode minimum energy required to extract an electron from the surface of a metal or a semiconductor to the outside of the surface) is an indicator of hole injection and electron injection properties of the light-emitting layer. The electrode for injecting holes has preferably a large work function, and the electrode for injecting electrons has preferably a small work function.

A wavelength plate, a polarization plate, and an antireflection film are preferably formed over an opposing substrate 145. As the wavelength plate, λ/4 and λ/2 are sequentially formed to set a slow axis.

Completing the state shown in FIG. 6C, the light-emitting element is preferably packaged so as not to be exposed to the air by an airtight protecting film that is hardly degassed (laminate film, ultraviolet curable resin film, or the like) or cover material.

Example 6

In Example 5, a bottom emission light-emitting device shown in FIG. 6C that is manufactured according to the present invention is explained. In Example 6, a top emission light-emitting device shown in FIG. 7A and a dual emission light-emitting device shown in FIG. 7C, each of which is manufactured according to the present invention, are explained.

A dual emission light-emitting device is firstly explained. As a material for a hole injecting electrode, a transparent conductive film such as ITO, ITSO, ZnO, IZO, or GZO can be used as in the case with Example 5. In case of using the ITSO as the pixel electrode 126, a plurality of layers of ITSO containing silicon oxides with different concentrations can be stacked. Preferably, a bottom ITSO layer (at the side of a source wiring or a drain wiring) has preferably a low concentration silicon oxide, and a top ITSO layer (at the side of a light-emitting layer) has preferably a high concentration silicon oxide. Accordingly, the connection between the pixel electrode 126 and a TFT can be kept in low resistance, and the hole injection efficiency to an electroluminescent layer can be improved. Of course, the pixel electrode can be formed by stacking the other material and the ITSO (for example, an ITO layer and an ITSO layer are sequentially stacked). Alternatively, a lamination layer composed of the further other materials may be formed.

As an electron injecting electrode 143, a thin aluminum film with a thickness of 1 to 10 nm, an aluminum film containing traces of Li or the like is used to pass light generated in a light-emitting layer therethrough. Therefore, a dual emission light-emitting device that can emit light generated in a light-emitting element from both of top and bottom surfaces can be obtained (FIG. 7C).

Figure 7A:
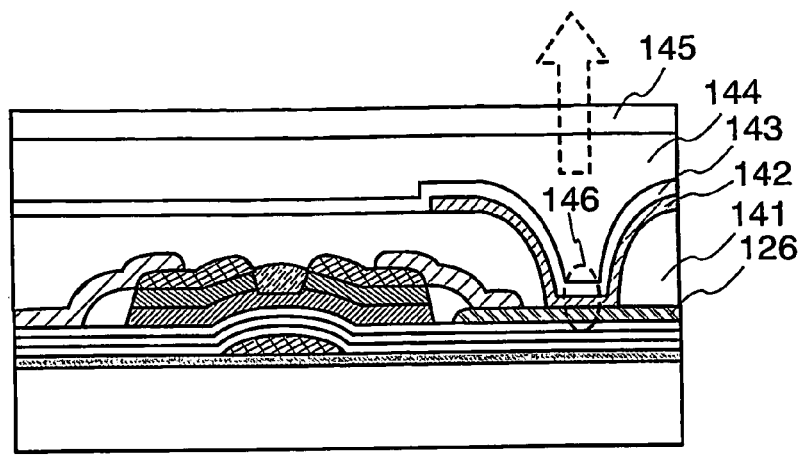
FIGS. 7A to 7C are explanatory views for showing a top emission light-emitting device, a bottom emission light-emitting device, and a dual emission light-emitting device according to the present invention.
Figure 7C:
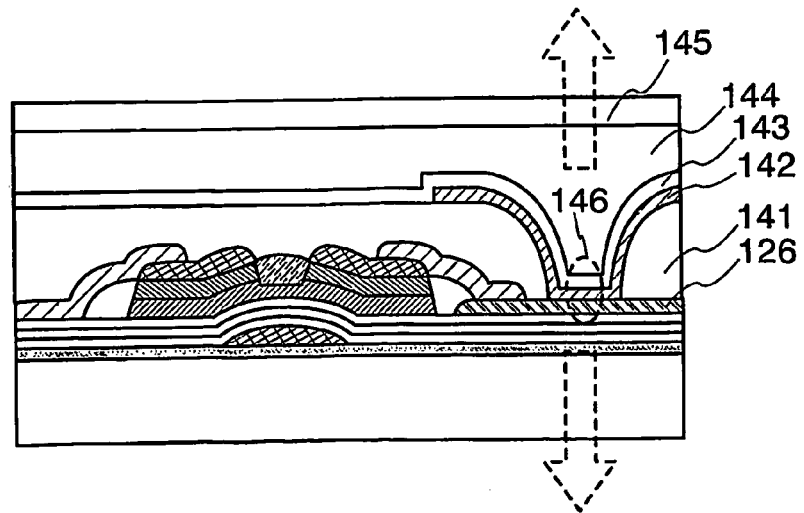

In FIGS. 7A to 7C, reference numeral 141 denotes a bank; 142, an organic compound layer; 144, a passivation film; 145, an opposing substrate; and 146, a light-emitting element.

Next, a top emission light-emitting device is explained with reference to FIG. 7A. In general, a top emission light-emitting device can be obtained in which light can be emitted from the side that is opposite to a substrate (top direction) according to the procedure: the pixel electrode 126 serving as a hole injecting electrode and an electron injecting electrode 143 of a bottom emission type as shown in FIG. 7B are counterchanged, and layers containing organic compounds are inversely stacked to reverse the polarity of a TFT (n-type TFT is used). In case that an electrode and layers containing organic compounds are inversely stacked as shown in FIG. 7A, a high stable light-emitting device can be obtained with improved emission efficiency and with low power consumption by forming the pixel electrode 126 to have a lamination structure composed of light-transmitting oxide conductive layers containing different concentrations of silicon oxides. As the electron injecting electrode 143, a metal electrode having light-reflectivity or the like can be used.

Example 7

Figure 9A:
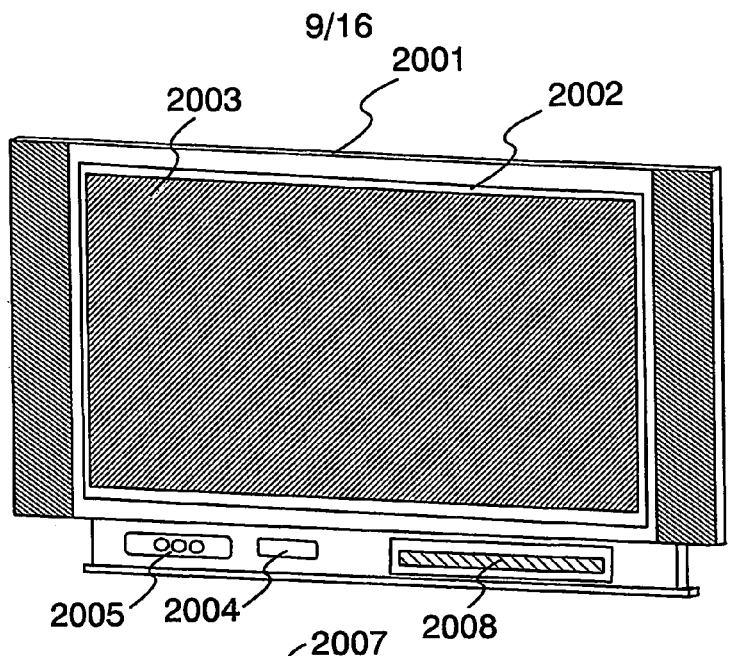
FIGS. 9A to 9C are explanatory views for showing one example of an electric appliance according to the present invention.
Figure 9B:
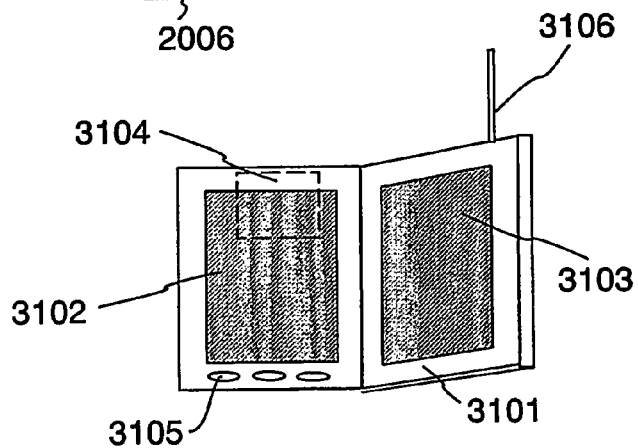
Figure 9C:
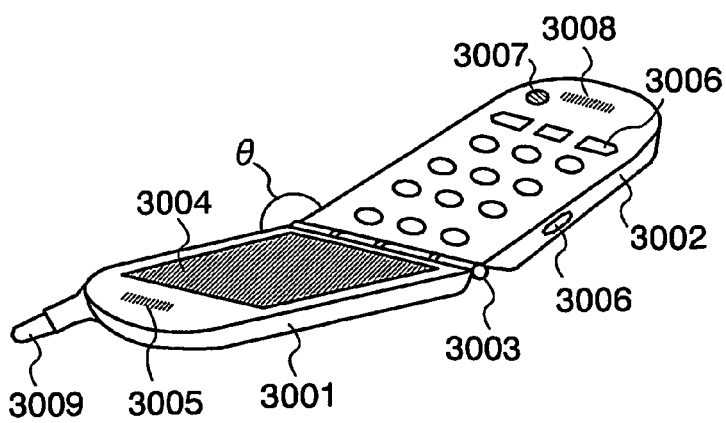

As an example of an electric appliance using a liquid display panel explained in Example 4 or an electroluminescent panel explained in Examples 5, 6, a TV reception set, a portable book (electronic book), and a cellular phone shown in FIGS. 9A to 9C can be completed.

FIG. 9A shows a TV reception set in which a display module 2002 utilizing liquid crystals or electroluminescent elements is built in a housing 2001; and a receiver 2005 receives general TV broadcasting, and exchanges information one-directionally (a sender to receiver) and bi-directionally (between a sender and a receiver, or between receivers) by connecting to a wireless or a wired communication network via a modem 2004. The TV reception set can be operated by switches built in the housing or a wireless remote control 2006. The remote control 2006 can be provided with a display portion 2007 to display information.

A sub-screen 2008 manufactured by a second display module for displaying channels or volumes thereon can be provided to the TV reception set in addition to a main-screen 2003. The main-screen 2003 may be manufactured by an electroluminescent display module having a good viewing angle. The sub-screen may be manufactured by a liquid crystal display module that can display images at low power consumption. To place priority on reducing the power consumption, the main-screen 2003 may be manufactured by a liquid crystal display module, and the sub-screen may be manufactured by an electroluminescent display module that enable the sub-screen to flash.

FIG. 9B shows a portable book (electronic book) composed of a main body 3101, display portions 3102, 3103, a memory medium 3104, operation switches 3105, an antenna 3106, and the like.

FIG. 9C shows a cellular phone. Reference numeral 3001 denotes a display panel, and 3002 denotes an operation panel. The display panel 3001 and the operation panel 3002 are connected with each other via a connecting portion 3003. The angle θ can be arbitrarily changed at the connecting portion 3003 between a face provided with a display portion 3004 on the display panel 3001 and a face provided with operation keys 3006 on the operation panel 3002. The cellular phone also comprises a voice output portion 3005, operation keys 3006, a power source switch 3007, a voice input portion 3008, and an antenna 3009.

Example 8

Figure 10:
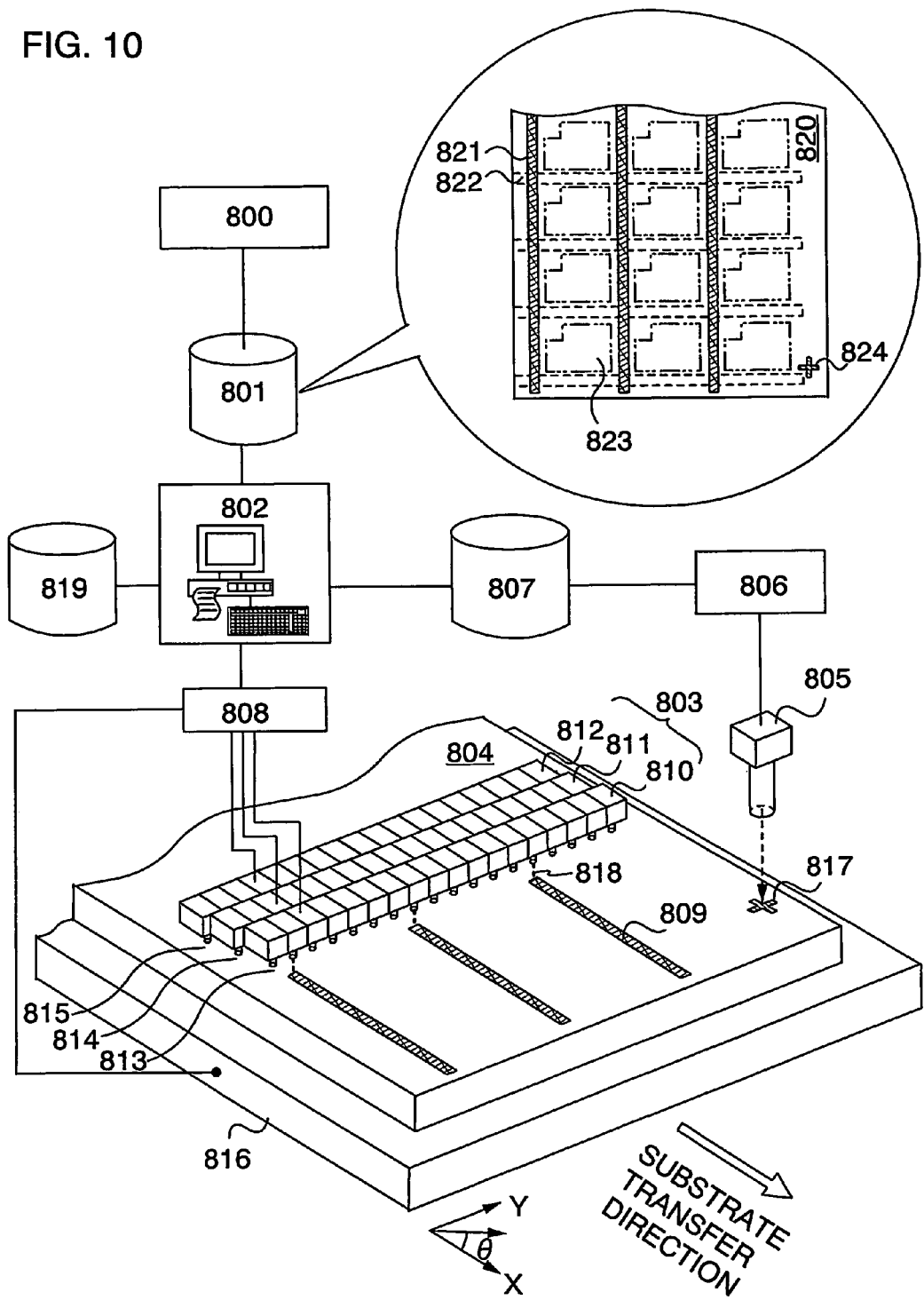
FIG. 10 shows a configuration of a droplet discharging system.

A semiconductor element according to the present invention is preferably formed by a droplet discharging system shown in FIG. 10. Firstly, a circuit design is conducted such as a CAD, a CAM, a CAE, or the like, and a desired layout of a thin film and an alignment marker is determined by a circuit design tool 800.

Data 801 of a thin film pattern including a designed layout of a thin film and an alignment marker is inputted into a computer 802 for controlling a droplet discharging device via an information network such as a memory medium or a LAN (Local Area Network). Based on the data 801 of a thin film pattern, a nozzle having a discharge opening with an optimum diameter, which stores a composite including a material for forming the thin film, or which is connected to a tank for storing the composite, is selected among other nozzles (devices for spraying liquids or gasses from a fine-ended opening) of a droplet discharging means 803; then, a scanning path (moving path) of the droplet discharging means 803 is determined. In case that an optimum nozzle has been determined in advance, only a moving path of the nozzle may be determined.

An alignment marker 817 is formed by photolithography technique or laser light over a substrate 804 to be provided with the thin film. The substrate provided with an alignment marker is put on a stage 816 in the droplet discharging device, and the position of the alignment marker is detected by a imaging means 805 installed in the device, then, it is inputted as position information 807 into a computer 802 via an image processing device 806. The computer 802 verifies the data 801 of the thin film pattern designed by a CAD or the like and the position information 807 obtained by the imaging means 805 to conduct alignment of the substrate 804 and the droplet discharging means 803.

Thereafter, the droplet discharging means 803 controlled by a controller 808 discharges a composite 818 according to the determined scanning path, and a desired thin film pattern 809 is formed. The discharge quantity can be appropriately controlled by selecting the diameter of a discharge opening. However, the discharge quantity is slightly varied by several conditions such as the moving speed of the discharge opening, the distance between the discharge opening and the substrate, the discharging speed of a composite, the atmosphere of the discharging space, the temperature or the humidity of the discharging space. Hence, it is desired to control these conditions. Optimum conditions are preferably identified in advance by experiments or evaluations, and these results are preferably databased per materials of the composite.

As a thin film pattern data, a circuit diagram or the like of an active matrix TFT substrate used for such as a liquid crystal display device or an electroluminescent display device can be nominated. FIG. 10 shows a schematic view of a circuit diagram in a circle for showing a conductive film used for such the active matrix TFT substrate. Reference numeral 821 denotes a so-called gate wiring; 822, a source signal line (second wiring); 823, a pixel electrode, or a hole injecting electrode or an electron injecting electrode; 820, a substrate; and 824, an alignment marker. Of course, a thin film pattern 809 corresponds to the gate wiring 821 in thin film pattern information.

Further, the droplet discharging means 803 has, but not exclusively, an integrated combination of nozzles 810, 811, and 812. Each nozzle has a plurality of discharge openings 813, 814, and 815. The foregoing thin film pattern 809 is formed by selecting a predetermined discharge opening 813 in the nozzle 810.

The droplet discharging means 803 is preferably provided with a plurality of nozzles having different discharge openings, discharge quantity, or nozzle pitches to be able to manufacture thin film patterns having various line widths and to improve tact time. The distances between the discharge openings are preferably narrow as much as possible. Further, a nozzle having a length of 1 m or more is preferably provided to the droplet discharging means 803 to conduct high throughput discharging over a substrate having a size of from 1×1 m or more, or a twice or three times as large as that. The droplet discharging means 803 may be retractable to control freely the distance between the discharge openings. To obtain high resolution, that is, to depict a smooth pattern, the nozzle or a head may be leaned. Accordingly, the drawing on a large area such as a rectangular area becomes possible.

Nozzles of the head having different pitches may be provided to one head in parallel. In this instance, discharge opening diameters may be the same or different. In case of the droplet discharging device using a plurality of nozzles as above mentioned, it is required that a waiting position for a nozzle not in use is provided. The waiting position can be provided with a gas supplying means and a showerhead to substitute the atmosphere in the waiting position for the atmosphere that is the same as the gas of a solvent of the composite. Accordingly, the desiccation can be prevented at some level. Moreover, a clean unit or the like that supplies clean air to reduce dust in a work place may be provided.

Figure 11A:
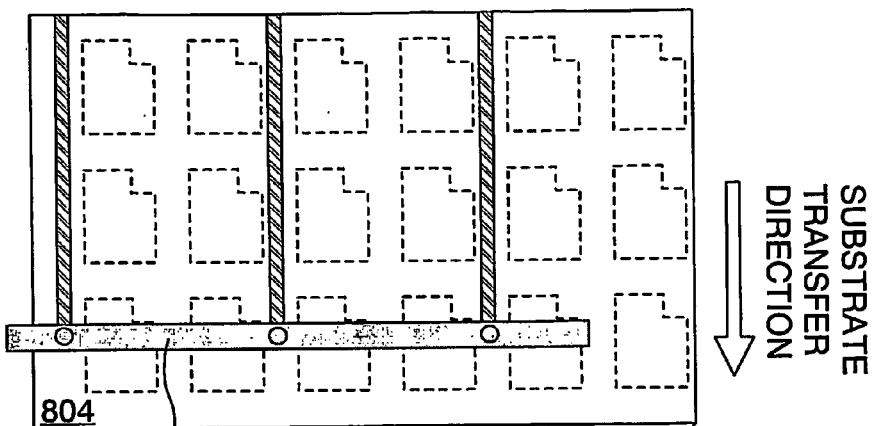
FIGS. 11A and 11B are explanatory views for showing wirings formed by discharging separately even-row and oddrow wirings using a nozzle with a pitch of n-times as a pixel pitch according to Embodiment.
Figure 11B:
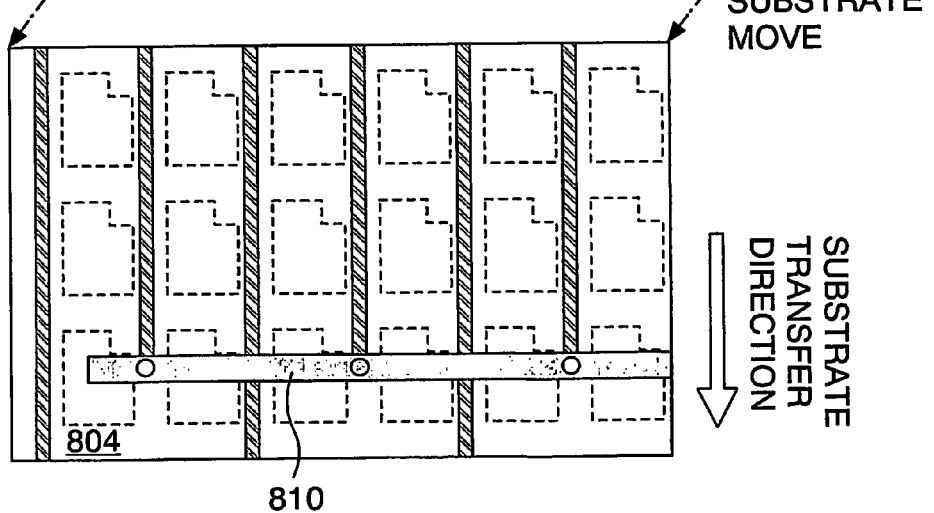

In case that the distances between discharge openings can not be narrowed due to the specifications of the nozzle 803, the pitch of a nozzle may be designed to be integer multiple of a pixel in a display device. Therefore, as shown in FIGS. 11A and 11B, a composite can be discharged over the substrate 804 by shifting the substrate 804. As the imaging means 805, a camera using a semiconductor element that converts the strong and weak of light to an electric signal such as a CCD (charge coupled device) can be used.

The foregoing method is to scan the fixed substrate 804 on a stage 816 by the droplet discharging means 803 along with the determined path in order to form the thin film pattern 809. On the other hand, the thin film pattern 809 may be formed in the procedure, that is, the droplet discharging means 803 is fixed, and the stage 809 is transported in XYθ directions along with a path determined by the data 801 of a thin film pattern. In case that the droplet discharging means 803 has a plurality of nozzles, it is required to determine a nozzle having a discharge opening with an optimum diameter, which stores a composite containing a material for forming the thin film or which is connected to a tank for storing the composite.

Further, a plurality of nozzles having redundancy may be used. For example, when the nozzle 812 (or 811) discharges a composite firstly, discharge conditions may be controlled so that the nozzle 810 discharges a composite simultaneously with the discharge of the nozzle 812 (or 811). Accordingly, a composite can be discharged from the back nozzle 810 despite that the front nozzle have some troubles such as the blockage in the discharge openings, and so it becomes possible at least to prevent wirings from breaking or the like.

The foregoing method uses only one predetermined discharge opening of the nozzle 810 to form the thin film pattern 809. Alternatively, as shown in FIGS. 12A to 15C, a plurality of nozzles can be used to discharge a composite depending on the line width or thickness of a thin film to be formed.

Figure 12A:
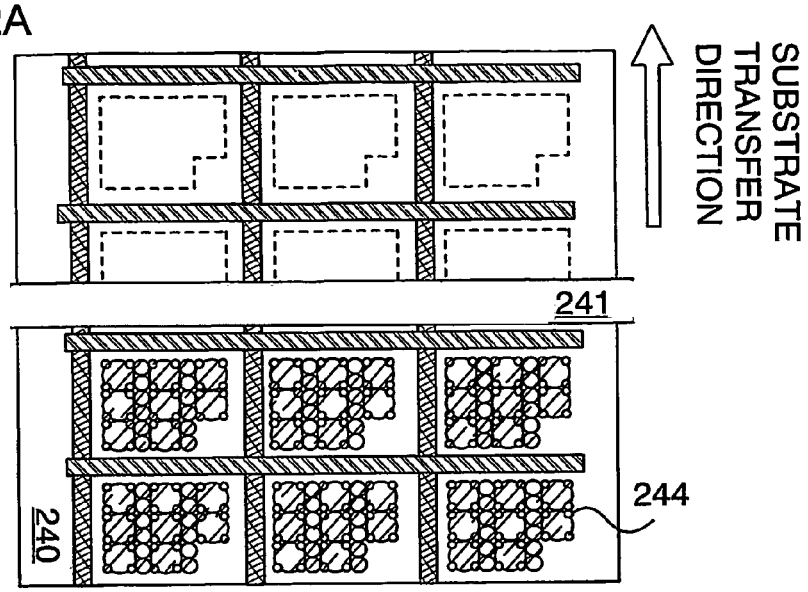
FIGS. 12A to 12D are explanatory views for showing a pixel electrode formed by discharging with a plurality of nozzles having different discharge opening diameters according to Embodiment.
Figure 12B:
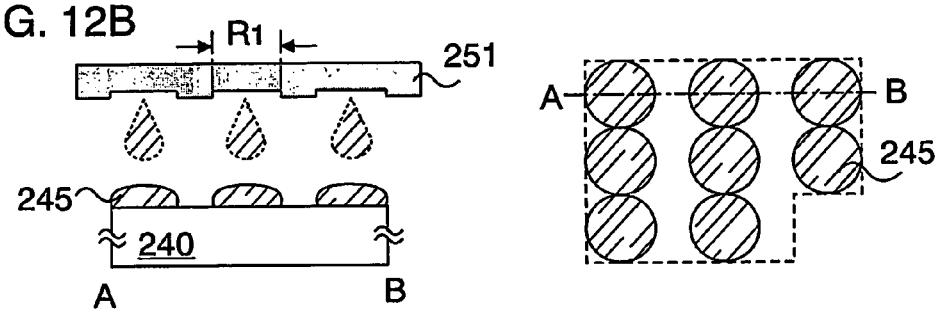
Figure 12C:
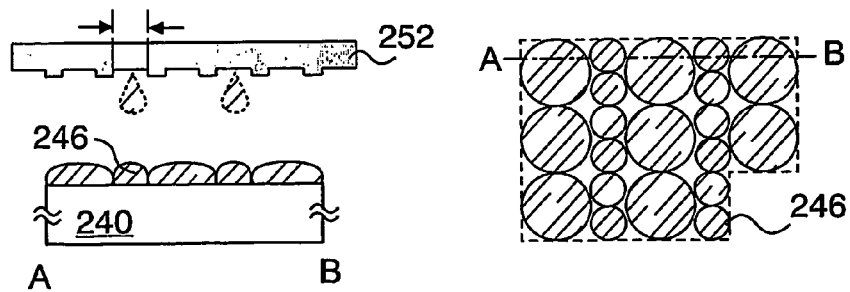
Figure 12D:
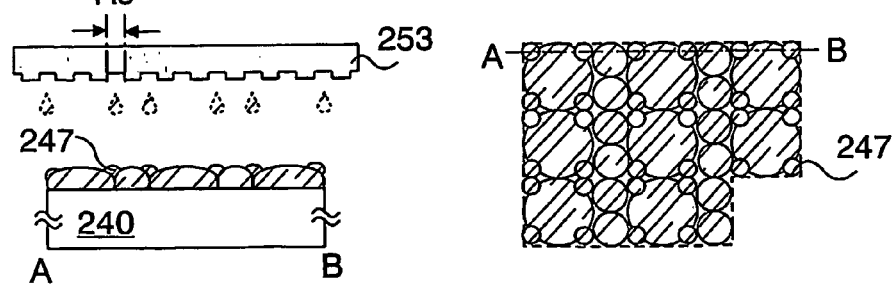
Figure 13A:
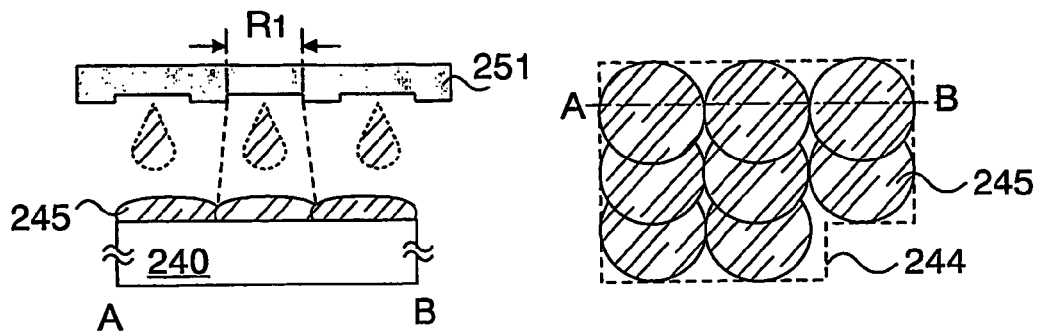
FIGS. 13A to 13C are explanatory views for showing a planarization wiring formed by discharging with a plurality of nozzles having different discharge opening diameters according to Embodiment.
Figure 13B:
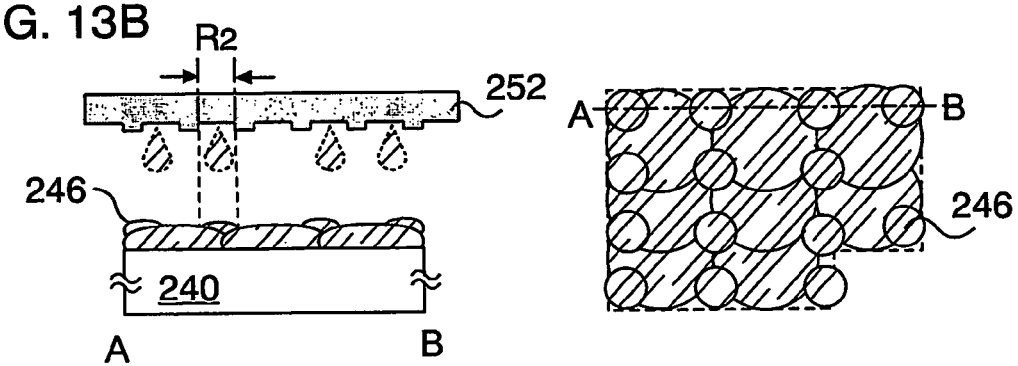
Figure 13C:
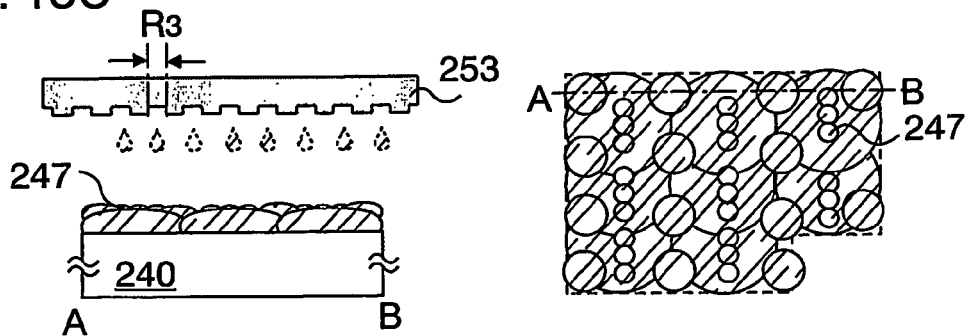

FIGS. 12A to 12D and FIGS. 13A to 13C show that, for example, a pixel electrode pattern 244 is formed over a substrate 240. Here, a droplet discharging means 241 composed of a three nozzles 251 to 253 having different sizes of $R_1$, $R_2$, and $R_3$ ($R_1 > R_2 > R_3$) is used. Firstly, a composite 245 is discharged by using the nozzle 251 having a discharge opening with a maximum diameter (FIG. 12B or 13A). Next, the nozzle 252 having a discharge opening with a smaller diameter than that of the nozzle 251 is used to discharge selectively a composite 246 at the portion that cannot be drawn or that is provided with irregularities by the discharge opening with a maximum diameter (FIG. 12C or 13B). Thereafter, the surface of the pattern is smoothed as the need arises by selectively discharging a composite 247 with the nozzle 253 having a discharge opening with a minimum diameter (FIG. 12D or 13C). The method can be effectively used to manufacture a comparative big conductor such as a pixel electrode. A planarized pattern with no irregularities can be manufactured by this method.

Figure 14:
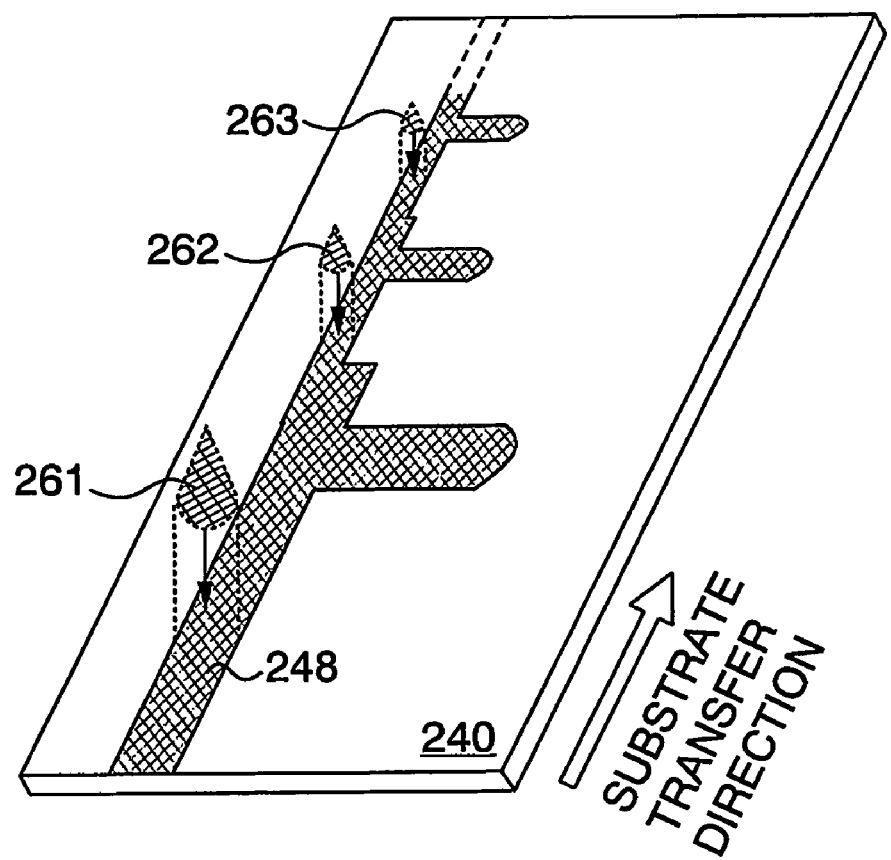
FIG. 14 is an explanatory view for showing a wiring having different line widths formed by discharging with a plurality of nozzles having different discharge opening diameters according to Embodiment.

FIG. 14 shows the state that a wiring pattern 248 is formed over the substrate 240. As the droplet discharging means, the foregoing nozzles 251 to 253 are used. Since the quantity of each droplet 261 to 263 discharged from these nozzles is different, a pattern with different line widths can be easily manufactured as illustrated in FIG. 14.

Figure 15A:
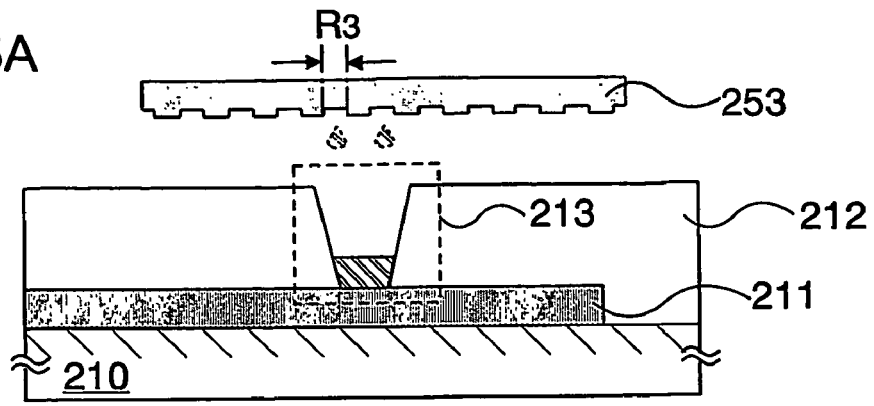
FIGS. 15A to 15C are explanatory views for showing an opening portion filled with a conductive material by discharging with a plurality of nozzles having different discharge opening diameters according to Embodiment.
Figure 15B:
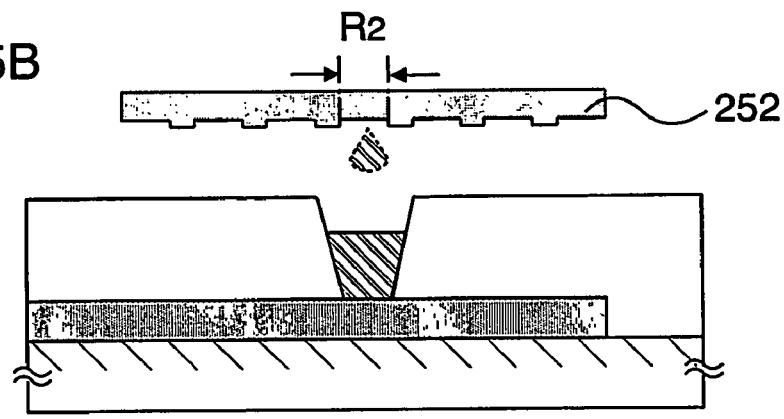
Figure 15C:
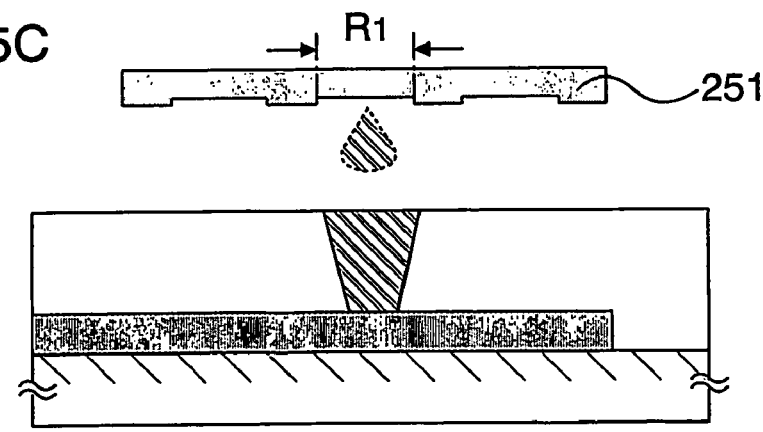

FIGS. 15A to 15C show a method for forming, for example, a conductive film by sequentially discharging a composite to fill an opening portion 213. Reference numeral 210 denotes a substrate; 211, a semiconductor or a conductor; and 212, an insulator. The insulator 212 is provided with an opening 213. The composite is discharged by a droplet discharging means comprising a plurality of nozzles 251 to 253 arranged in a plurality of lines having discharging openings arranged in uniaxial direction at the foregoing each line. The diameter of the opening becomes large toward the bottom to the top. Firstly, the opening 213 is filled with a composite up to the bottom by the nozzle 253 having a discharge opening with a diameter of $R_3$ (FIG. 15A). Then, the opening 213 is filled with a composite up to the middle by the nozzle 252 having a discharge opening with a diameter of $R_2$ (FIG. 15B). And then, the opening 213 is filled with a composite up to the top by the nozzle 251 having a discharge opening with a diameter of $R_1$ (FIG. 15C). According to this method, a planarized conductive layer can be formed by discharging a composite to fill the opening. Therefore, the insulator 212 having an opening with a high aspect ratio can be provided with a planarization wiring without generating a void.

As mentioned above, a droplet discharging system used for forming a thin film or a wiring comprises an inputting means for inputting data for showing a thin film pattern; a setting means for setting a moving path of a nozzle for discharging a composite containing a material for forming the thin film; an imaging means for detecting an alignment marker formed over a substrate; and a controlling means for controlling moving path of the nozzle. Therefore, a nozzle or a moving path of a substrate in droplet discharging is required to be accurately controlled. By installing a program for controlling conditions of discharging a composite to a computer for controlling the droplet discharging system, conditions such as a moving speed of a substrate or a nozzle, discharge quantity, a spray distance, spray speed, a discharge atmosphere, discharge temperature, discharge humidity, heating temperature for a substrate, and the like can be accurately controlled.

Accordingly, a high throughput manufacture for a short tact time of a thin film or a wiring having a desired width, thickness, and form can be precisely conducted at a desired portion. Moreover, manufacturing yields of a semiconductor element such as a TFT manufactured by using the thin film or the wiring; a light-emitting device such as a liquid crystal display or an organic electroluminescent display manufactured by using the semiconductor element; an LSI; or the like can be improved. Especially, according to the present invention, a thin film or a wiring can be formed at any portion, and a width, a thickness, and a form of the pattern can be controlled. Therefore, a large area's semiconductor element substrate having the size of from 1×1 m or more, or a twice or three times as large as that can be manufactured at low costs in high yields.

INDUSTRIAL APPLICABILITY

According to the present invention, a source region and a drain region are formed by the foregoing method, and the portion for serving as a channel region is covered by an insulating film serving as a channel protecting film to form an island-like semiconductor film. Accordingly, a process can be simplified since a resist mask is not required. As mentioned above, one aspect of the present invention is to provide a novel means for forming a semiconductor element by combining a method for removing a single conductivity semiconductor film using a metal mask of a source electrode and a drain electrode, and a method, which is specific to a channel protective type, for forming a channel protective film to prevent a channel region from removing. A semiconductor element can be manufactured by using only a metal mask of a source electrode and a drain electrode without using any resist mask according to the foregoing structure. Therefore, the semiconductor element and the method for manufacturing the semiconductor element are useful for providing an optimum structure and a process having the proper conditions to be actively formed by droplet discharging.

The invention claimed is:

1. A semiconductor element comprising:
   a layer comprising titanium oxide formed over an entire surface of a substrate;
   a gate electrode layer formed over the layer comprising titanium oxide;
   a gate insulating film formed in contact with a top surface of the gate electrode layer and a top surface of the layer comprising titanium oxide;
   a semiconductor film formed over the gate insulating film;
   a pair of n-type impurity regions formed over the semiconductor film;
   an insulating film that is interposed between the pair of n-type impurity regions and that is formed over the semiconductor film; and
   a conductive layer formed over the pair of n-type impurity regions,
   wherein the insulating film is formed to have a laminated-layer structure.

2. A semiconductor element comprising:
   a layer comprising titanium oxide formed over an entire surface of a substrate;
   a gate electrode layer formed over the layer comprising titanium oxide;
   a gate insulating film formed in contact with a top surface of the gate electrode layer and a top surface of the layer comprising titanium oxide;
   a semiconductor film formed over the gate insulating film;
   a pair of n-type impurity regions formed over the semiconductor film;
   an insulating film having a thickness of 100 nm or more that is interposed between the pair of n-type impurity regions and that is formed over the semiconductor film; and
   a conductive layer formed over the pair of n-type impurity regions,
   wherein the insulating film is formed to have a laminated-layer structure.

3. A semiconductor element comprising:
   a layer comprising titanium oxide formed over an entire surface of a substrate;
   a gate electrode layer formed over the layer comprising titanium oxide;
   a gate insulating film formed in contact with a top surface of the gate electrode layer and a top surface of the layer comprising titanium oxide;
   a semiconductor film formed over the gate insulating film;
   a pair of n-type impurity regions formed over the semiconductor film;
   an insulating film that is interposed between the pair of n-type impurity regions and that is formed over the semiconductor film; and
   a conductive layer formed over the pair of n-type impurity regions,
   wherein a thickness of a portion of the semiconductor film over which the insulating film is formed is thinner than that of the other portion of the semiconductor film,
   wherein the portion of the semiconductor film has a thickness of 10 nm or more, and
   wherein the insulating film is formed to have a laminated-layer structure.

4. A semiconductor element according to any one of claims 1 to 3, wherein the insulating film comprises at least one selected from the group consisting of polyimide, acrylic, and a material which has a skeleton formed by a bond of silicon and oxygen, and which includes at least hydrogen as a substituent, or at least one selected from the group consisting of fluoride, alkyl group, and aromatic hydrocarbon as a substituent.

5. A semiconductor element according to any one of claims 1 to 3, wherein the semiconductor element is incorporated in at least one selected from the group consisting of a TV reception set, an electronic book and a cellular phone.

6. A semiconductor element according to any one of claims 1 to 3, wherein the gate electrode layer comprises a transparent conductive film.

7. A display device comprising:
a layer comprising titanium oxide formed over an entire surface of a substrate;
a gate electrode layer formed over the layer comprising titanium oxide;
a gate insulating film formed in contact with a top surface of the gate electrode layer and a top surface of the layer comprising titanium oxide;
a semiconductor film formed over the gate insulating film;
a pair of n-type impurity regions formed over the semiconductor film;
an insulating film that is interposed between the pair of n-type impurity regions and that is formed over the semiconductor film;
a conductive layer formed over the pair of n-type impurity regions; and
a pixel electrode electrically connected to the conductive layer,
wherein the insulating film is formed to have a laminated-layer structure.

8. A display device comprising:
a layer comprising titanium oxide formed over an entire surface of a substrate;
a gate electrode layer formed over the layer comprising titanium oxide;
a gate insulating film formed in contact with a top surface of the gate electrode layer and a top surface of the layer comprising titanium oxide;
a semiconductor film formed over the gate insulating film;
a pair of n-type impurity regions formed over the semiconductor film;
an insulating film having a thickness of 100 nm or more that is interposed between the pair of n-type impurity regions and that is formed over the semiconductor film;
a conductive layer formed over the pair of n-type impurity regions; and
a pixel electrode electrically connected to the conductive layer,
wherein the insulating film is formed to have a laminated-layer structure.

9. A display device comprising:
a layer comprising titanium oxide formed over an entire surface of a substrate;
a gate electrode layer formed over the layer comprising titanium oxide;
a gate insulating film formed in contact with a top surface of the gate electrode layer and a top surface of the layer comprising titanium oxide;
a semiconductor film formed over the gate insulating film;
a pair of n-type impurity regions formed over the semiconductor film;
an insulating film that is interposed between the pair of n-type impurity regions and that is formed over the semiconductor film;
a conductive layer formed over the pair of n-type impurity regions; and
a pixel electrode electrically connected to the conductive layer,
wherein a thickness of a portion of the semiconductor film over which the insulating film is formed is thinner than that of the other portion of the semiconductor film,
wherein the portion of the semiconductor film has a thickness of 10 nm or more, and
wherein the insulating film is formed to have a laminated-layer structure.

10. A display device according to any one of claims 7 to 9, wherein the insulating film comprises at least one selected from the group consisting of polyimide, acrylic, and a material which has a skeleton formed by a bond of silicon and oxygen, and which includes at least hydrogen as a substituent, or at least one selected from the group consisting of fluoride, alkyl group, and aromatic hydrocarbon as a substituent.

11. A display device according to any one of claims 7 to 9, wherein the liquid crystal display device is incorporated in at least one selected from the group consisting of a TV reception set, an electronic book and a cellular phone.

12. A display according to any one of claims 7 to 9, wherein the gate electrode layer comprises a transparent conductive film.

* * * * *